United States Patent
Ho et al.

(10) Patent No.: US 12,262,627 B2
(45) Date of Patent: Mar. 25, 2025

(54) N-DOPED ELECTRICALLY CONDUCTIVE ORGANIC MATERIALS

(71) Applicant: National University of Singapore, Singapore (SG)

(72) Inventors: Peter Kian-Hoon Ho, Singapore (SG); Lay-Lay Chua, Singapore (SG); Rui-Qi Png, Singapore (SG); Cindy Guan-Yu Tang, Singapore (SG)

(73) Assignee: National University of Singapore, Singapore (SG)

( * ) Notice: Subject to any disclaimer, the term of this patent is extended or adjusted under 35 U.S.C. 154(b) by 589 days.

(21) Appl. No.: 17/416,390

(22) PCT Filed: Dec. 21, 2018

(86) PCT No.: PCT/SG2018/050626
§ 371 (c)(1),
(2) Date: Jun. 18, 2021

(87) PCT Pub. No.: WO2020/130934
PCT Pub. Date: Jun. 25, 2020

(65) Prior Publication Data
US 2022/0059769 A1    Feb. 24, 2022

(51) Int. Cl.
*H10K 85/10*    (2023.01)
*H10K 50/11*    (2023.01)
*H10K 71/12*    (2023.01)
*H10K 71/30*    (2023.01)

(52) U.S. Cl.
CPC .......... *H10K 85/151* (2023.02); *H10K 71/12* (2023.02); *H10K 71/30* (2023.02); *H10K 85/113* (2023.02); *H10K 85/114* (2023.02); *H10K 50/11* (2023.02)

(58) Field of Classification Search
CPC .................................................. H10K 85/151
See application file for complete search history.

(56) References Cited

U.S. PATENT DOCUMENTS

| | | | |
|---|---|---|---|
| 4,728,589 A * | 3/1988 | MacDiarmid .......... | H10K 71/30 429/212 |
| 9,231,219 B2 | 1/2016 | Barlow et al. | |
| 2016/0322568 A1 | 11/2016 | Fadhel et al. | |
| 2018/0277764 A1* | 9/2018 | Chua ....................... | C08L 65/00 |

FOREIGN PATENT DOCUMENTS

| WO | 2016126209 A1 | 8/2016 |
|---|---|---|
| WO | 2017003382 A1 | 1/2017 |

OTHER PUBLICATIONS

PCT International Search Report issued in PCT application No. PCT/SG2018/050626 on Sep. 11, 2019.
(Continued)

*Primary Examiner* — William D Young
(74) *Attorney, Agent, or Firm* — Botos Churchill IP Law LLP

(57) ABSTRACT

A composition comprising: an organic semiconductor comprising one or more aromatic or heteroaromatic moieties; one or more cations covalently bonded to the organic semiconductor, or to a second material; and at least one anion donor selected from the class of divalent and higher valent anions; wherein the organic semiconductor has an electron affinity between 1.5 and 4.5 eV.

23 Claims, 10 Drawing Sheets

(56) References Cited

OTHER PUBLICATIONS

Written Opinion of the International Searching Authority issued in PCT application No. PCT/SG2018/050626 on Sep. 11, 2019.
Voortman, T. P., et al., "Stabilizing Cations in the Backbones of Conjugated Polymers". J. Mater, Chem. C, 2014, vol. 2, pp. 3407-3415.
Tang, C.G., et al., "Multivalent Anions as Universal Latent Electron Donors", Nature, vol. 573, pp. 519-525 ( 2019), available at https://doi.org/10.1038/s41586-019-1575-7.

* cited by examiner

N-DOPED ELECTRICALLY CONDUCTIVE ORGANIC MATERIALS

CROSS-REFERENCE TO RELATED APPLICATIONS

The present application is a national phase entry under 35 U.S.C. § 371 of International Application No. PCT/SG2018/050626, filed Dec. 21, 2018, published in English, which is incorporated herein by reference in its entirety.

BACKGROUND

Organic semiconductors are known for use in a wide range of applications including organic light-emitting devices, photovoltaic devices, photosensors, organic thin film transistors and memory array devices.

Devices containing organic semiconductors can offer benefits such as low weight, low power consumption and flexibility. Moreover, use of soluble organic semiconductors allows use of solution processing in device manufacture, for example inkjet printing or spin-coating.

Doping of organic semiconductors is desirable for various applications, for example to provide a charge injection layer providing good ohmic contact between an electrode layer and an organic semiconductor layer.

Lin et al, Nat. Mater. 16 (2017) 1209 discloses n-doping of organic semiconductors having electron affinities as small as 2.8 eV using a nineteen-electron transition-metal organometallic dopant derived from a (pentamethylcyclopentadienyl)(arene)ruthenium dimer.

Use of 4-(1,3-dimethyl-2,3-dihydro-1H-benzoimidazol-2-yl)phenyl)dimethylamine (N-DMBI) as an n-dopant precursor is disclosed in Wei et al, J. Am. Chem. Soc. 132 (2010) 8852.

SUMMARY n-Doping of organic semiconductors is challenging; although materials capable of donating an electron to an organic semiconductor are known, they tend to be unstable due to their shallow ionisation energy needed for n-doping. This is particularly problematic for n-doping of organic semiconductors with a lowest unoccupied molecular orbital (LUMO) which is shallow, i.e. having a low electron affinity.

There are limited air-stable n-dopants for providing electron-doped organic electron-injection/extraction layers with a work function (WF) sufficiently low to efficiently inject electrons into or collect electrons from semiconductors which have electron affinities ($E_A$) in the range of 4.5 eV to 1.5 eV. Such semiconductors are important for light-emitting, solar conversion, light-detecting, transistor and sensor applications, for example. One way is to use 19-electron molecular dopants. However this requires light activation which may not always be desirable. Also the by-product of doping may interfere with device operation. An alternative way is to use molecular precursor dopants which form the active intermediate by cracking during co-evaporation or by heating after mixing with the semiconductor. However such dopants may have electron donor level that may not be sufficiently shallow. Therefore, there is a need to develop strategies for n-doping organic semiconductors which allow processing in an ambient environment, e.g. ambient solution-processing compatible strategies.

The present inventors have found that organic semiconductors may be n-doped by certain anions, allowing for n-doping to be achieved in a film containing an organic semiconductor and the anion.

Accordingly, in some embodiments the present disclosure addresses this need by providing a solution processable organic material that combines a selected low-$E_A$ organic semiconductor core with covalently bonded cation on the semiconductor or an alternate organic/inorganic material, and an 'electron donor anion' which is capable of n-doping the organic semiconductor. Optionally, n-doping occurs after film formation and optionally after one or more n-doping steps, to provide a self-compensated n-doped material, i.e. a material in which the negative charge of an electron accepted by the organic semiconductor is balanced by the positive charge of the covalently bound cation. The n-doped material may have a WF in the 4.8-1.5 eV range.

The present disclosure provides a composition comprising an organic material optionally comprising one or more aromatic moieties, one or more anion donors, and one or more cations. The cations can be bound to the organic material, or alternatively the composition can comprise one or more further organic materials to which the cations can be bound. The organic material can become electron-doped. The disclosure provides efficient electron injection and/or electron extraction to organic and other semiconductors with $E_A$ in the range of 4.5 eV to 1.5 eV, depending on the WF of the composition.

Work function as described herein is the difference between the Fermi level and the vacuum level of a material and can be measured by inferring from built-in potentials from electroabsorption measurements for the doped semiconductor layer in device, and ultraviolet photoemission measurements for the surface of the doped semiconductor layer.

Optionally, electron carrier density ranges from $10^{17}$-$10^{20}$ cm$^{-3}$. This can be measured by a number of methods, including absorption spectroscopy or XPS spectroscopy after calibration, field-effect conductivity, and Hall effect measurements.

Electron donor level as described herein corresponds to the negative of the adiabatic ionisation energy and is formally equivalent to the negative of the adiabatic first-electron-detachment energy of the species (and also negative of the electron affinity of the corresponding one-electron-less species). The electron donor level can be estimated from the gas phase ionisation energy. The gas phase ionisation energy can be determined theoretically by quantum chemical calculations or experimentally by photodetachment experiments.

The term, "deeper" as used herein in the context of electron donor levels and electron affinities, means "further from vacuum level".

In certain embodiments, these materials may possess one or more of the following characteristics:

(i) Up to 100% of the cationic groups may be covalently tethered to the organic semiconductor, or to a second material, and are described herein as "tethered" cationic groups. In some embodiments, a proportion of the cationic groups may be not covalently tethered to the organic semiconductor, or to a second material, and are described herein as "untethered" cationic groups. In some embodiments, a proportion of the untethered cationic groups relative to the tethered cationic groups is less than about 45%, less than about 40%, less than about 35%, less than about 30%, less than about 25%, less than about 20%, less than about 15%, less than about 10%, or less than about 5%.

(ii) The cationic group is selected from ammonium of formula $R_4N^+$, sulfonium $R_3S^+$, phosphonium $R_4P^+$, guanidinium $(NR)_3C^+$, oxonium $R_3O^+$, borinium $R_2B^+$, where R is a substituent, preferably $C_{1-12}$ alkyl, unsubstituted phenyl or phenyl substituted with one or more substituents, optionally one or more $C_{1-12}$ alkyl groups, hydrogen, oxygen, alkoxy or phenoxy with one or more substituents, optionally one or more $C_{1-12}$ alkyl groups, or a combination thereof; and heterocyclic cations including, without limitation, pyrrolidinium, morpholinium, imidazolium, pyridinium, pyrrolinium, pyrylium, pyrrolidinium, piperidinium, quinuclidinium, including their substituted analogues, or a combination thereof. Optionally, substituents of heterocyclic cations are selected from $C_{1-12}$ alkyl, unsubstituted phenyl or phenyl substituted with one or more substituents, optionally one or more $C_{1-12}$ alkyl groups, or a combination thereof.

(iii) The organic semiconductor has an electron affinity in the range between 1.5 and 4.5 eV, preferably between 1.8 and 4.5 eV, more preferably between 1.8 and 4.0 eV, most preferably between 1.8 and 3.5 eV.

(iv) The donor anion is a divalent or multivalent anion.

(v) The donor anion is oxalate, malonate, succinate, phosphate, phosphite, sulfate, sulfite, carbonate, ferrocyanide, ferricyanide, their substituted analogues, or combinations thereof.

(vi) The organic semiconductor is polymeric, oligomeric or a small molecule.

(vii) The backbone of a semiconducting polymer may be fully conjugated, partially conjugated, or non-conjugated with aromatic groups pendent therefrom.

In some embodiments, the electron affinity of the organic semiconductor may be deeper than the electron donor level of the donor anion. The electron donor level of the donor anion may vary depending on the environment of the donor anion. In some embodiments, heating of the composition described herein may result in doping of the organic semiconductor. Without wishing to be bound by theory, in some embodiments water molecules may stabilise the electron donor level and prevent electron transfer from the donor anion to the LUMO of the organic semiconductor. Accordingly, in some embodiments the donor anion may be an anion having a hydrated form and a dehydrated form wherein the electron donor level of the anion is shallower in its dehydrated form.

In some embodiments, the composition is activated to cause electron donation from the donor anion to the organic semiconductor. Thus, in some embodiments, the present disclosure provides a method of forming an n-doped semiconductor comprising activation of a composition as described herein.

In some embodiments, the composition is activated by one or more of heating, vacuum treatment and exposure to a dry environment. Without wishing to be bound by any theory, such treatment may cause reduction in the water content of the composition and activation of the donor anion. By a "dry environment" as used herein is meant an environment having a water content lower than that of ambient air, for example less than 1000 ppm or less than 100 ppm of water.

In some embodiments, the composition is activated by operation of a device comprising a layer comprising the composition between an anode for injection of holes and a cathode for injection of electrons.

In some embodiments, the present disclosure provides an n-doped organic semiconductor comprising one or more cations covalently bonded thereto and n-doped by an n-dopant derived from an anion donor selected from the class of divalent and higher valent anions.

In some embodiments, the n-doped organic semiconductor has a work function between about 1.5 eV and about 4.8 eV, preferably between about 1.8 and about 4.8 eV, more preferably between about 1.8 and about 4.3 eV, most preferably between about 1.8 and about 3.8 eV.

In some embodiments, the present disclosure provides a formulation comprising a composition as described herein dissolved or dispersed in a solvent.

In some embodiments, the present disclosure provides an organic electronic device comprising a layer comprising an n-doped organic semiconductor formed from a composition as described herein.

In some embodiments, the present disclosure provides a method of forming a layer of an organic electronic device comprising:

deposition of a formulation as described herein onto a surface; and n-doping of the organic semiconductor by the donor anion.

In some embodiments, n-doping of the organic semiconductor by the donor anion is achieved by activation as described herein.

In some embodiments, activation of the first formulation layer may occur in the completed device during operation of the device. This can be achieved, for example, in the presence of holes injected by the opposite contact to provide a second formulation layer. The second formulation layer may be referred to as an activated formulation layer.

DETAILED DESCRIPTION

Organic semiconductors as described herein include polymers, oligomers and small molecules.

Polymers as described herein are macromolecules with typically more than ten repeat units bonded together. The polymer may be a homopolymer in which all repeat units are the same or a copolymer containing two or more different repeat units. Polymers as described herein are suitably polydisperse.

Oligomers as described herein are molecules with optionally at least two and up to ten repeat units bonded together. The repeat units may be the same or the oligomer may contain two or more different repeat units.

By "repeat unit" as used herein is meant a unit that occurs at least twice in an oligomer or polymer.

Small molecules are molecules with no repeat units. Preferably, a small molecule organic semiconductor comprises at least one polycyclic aromatic or heteroaromatic group.

The compositions described herein may contain a divalent or higher valent donor anion (also referred to as a multivalent donor anion). In some embodiments, the valency of the anion is 2, 3 or 4.

In some embodiments, the organic semiconductor is a non-ionic or zwitterionic material and the donor anion is a component of an ionic material mixed with the organic semiconductor.

The ionic material mixed with the organic semiconductor may be an insulating polymer substituted with cationic side groups, for example vinyl polymers, such as quaternized polyallylamine, quaternized poly(ethyleneimine), poly(diallydimethylammonium); and acrylate polymers with quaternized amino side-chains.

In some embodiments, the organic semiconductor comprises a cationic group, optionally a covalently tethered cationic group which the donor anion is ionically bound to. It will therefore be understood that the composition as described herein may consist of the organic semiconductor comprising a cationic group to which the donor anion is ionically bonded.

The binding of the anion group to the cationic group may prevent diffusion of the anion and prevent interference of the cation in doping at a doping site of the organic semiconductor.

The cationic group may have formula (I):

wherein Sp is a spacer group; z is 0 or 1; and Cat is the cationic group.

The spacer group may be a group of formula —(CH$_2$)$_v$— where v is 1-8, preferably 2-4 and in which one or more non-adjacent CH$_2$ groups may be replaced with phenylene, O, S, C=O or COO and one or more of the H atoms may be replaced with F, for example a perfluoroalkyl chain, i.e., —(CF$_2$)$_v$— where v is 1-8, preferably 2; an alkoxy chain —(OCH$_2$CH$_2$)$_w$—, where w is 1-3, preferably 1; or a perfluoroalkoxy chain —(OCF$_2$CF$_2$)$_w$—, where w is 1-3, preferably 1.

A wide range of suitable cationic groups are known to the skilled person in organic chemistry. Examples include, without limitation ammonium (NH$_4^+$, NR$_4^+$), sulfonium R$_3$S$^+$, phosphonium RP guanidinium (NR)$_3$C$^+$, oxonium R$_3$O$^+$, borinium R$_2$B$^+$, where R is a substituent, preferably C$_{1-12}$ alkyl, unsubstituted phenyl or phenyl substituted with one or more substituents, optionally one or more C$_{1-12}$ alkyl groups, hydrogen, oxygen, alkoxy or phenoxy with one or more substituents, optionally one or more C$_{1-12}$ alkyl groups, or a combination thereof; and heterocyclic cations including, without limitation, pyrrolidinium, morpholinium, imidazolium, pyridinium, pyrrolinium, pyrylium, pyrrolidinium, piperidinium, quinuclidinium, including their substituted analogues, or a combination thereof. Optionally, substituents of heterocyclic cations are selected from C$_{1-12}$ alkyl, unsubstituted phenyl or phenyl substituted with one or more substituents, optionally one or more C$_{1-12}$ alkyl groups, or a combination thereof. The cation is more preferably selected from the group of weakly electrophilic cations. Examples include alkyl ammonium, morpholinium, imidazolium, guanidinium, pyrrolidonium, morpholium, quinuclidinium and a combination thereof. In some embodiments the cation may stabilize the anion and the final electron-doped organic semiconductor.

Preferably, the cation does not undergo electrochemical reduction up to an electrode potential of −3 V vs standard hydrogen electrode (SHE).

The cation preferably has low electrophilicity. Electrophilicity is the tendency of the said chemical moiety to take part in electrophilic reactions (i.e., formal electron-pair acceptance). One way to obtain low electrophilicity is through a large cation size.

Organic semiconductor. The organic semiconductor core can be any structures with a solid-state $E_A$ between 4.5-1.5 eV. The organic semiconductor comprises aromatic or heteroaromatic groups which may be monocyclic or fused.

In some embodiments, a semiconducting polymer as described herein has a non-conjugated backbone with aromatic or heteroaromatic groups, preferably fused aromatic or heteroaromatic groups, pendent from the polymer backbone.

In some embodiments, a semiconducting polymer as described herein is a conjugated polymer comprising repeat units containing aromatic or heteroaromatic groups which are conjugated together.

Exemplary conjugated polymers include polymers containing repeat units selected from one or more of arylene, heteroarylene, arylene vinylene, sulfur oxide, phosphine oxide and amine repeat units, and their substituted analogues.

Exemplary arylene repeat units include fluorene, phenylene, indenofluorene, phenanthrene, pyrene, naphthalene, perylene, and anthracene repeat units, each of which may independently be unsubstituted or substituted with one or more substituents, optionally one or more R groups as described below.

Exemplary arylene repeat units have formulae (II) and (III):

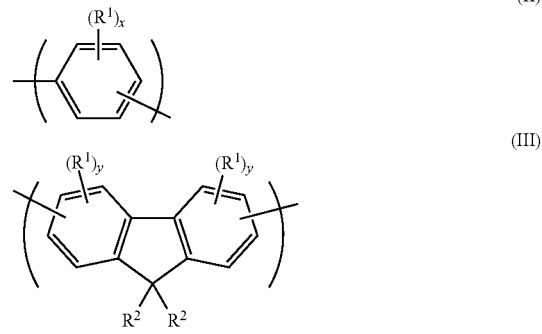

wherein: R$^1$ and R$^2$ independently in each occurrence is a substituent; x in each occurrence is independently 0, 1, 2, 3 or 4, preferably 1 or 2; and y independently in each occurrence is 1, 2 or 3, preferably 0.

R$^1$ and R$^2$ independently in each occurrence may be selected from the group consisting of:
non-ionic substituents, preferably:
  alkyl, optionally C$_{1-20}$ alkyl, wherein one or more non-adjacent, non-terminal C atoms may be replaced with optionally substituted aryl or heteroaryl, O, S, substituted N, C=O or —COO—, and one or more H atoms may be replaced with F;
  aryl and heteroaryl groups, preferably C$_{6-20}$ aryl groups, more preferably phenyl, which may be unsubstituted or substituted with one or more substituents, optionally one or more C$_{1-12}$ alkyl groups,
  N(R$^3$)$_2$ and OR$^3$ wherein R$^3$ in each occurrence is independently selected from H, C$_{1-20}$ alkyl, aryl and heteroaryl; and
  halides, cyano or nitro;
and
a group comprising a cation.

In an embodiment, the group comprising the cation may be as described with reference to formula (I). The cation can be pendent from the polymer backbone, i.e. it can be tethered to the polymer backbone.

By "non-terminal" C atom of an alkyl group as used herein is meant the methyl carbon of an n-alkyl chain or each methyl carbon atom of a branched alkyl chain.

In some embodiments, a cation of the semiconducting polymer is ionically bonded to a donor anion as described herein.

In some embodiments, the semiconducting polymer is non-ionic and the anion is ionically bonded to a cation of a separate material of the composition described herein.

In a preferred embodiment at least one $R^2$ group is a cationic group. Preferably both $R^2$ groups are cationic groups.

Exemplary heteroarylene repeat units include thiophene, azole, quinoxaline, benzothiadiazole, oxadiazole, and thienothiophene repeat units, each of which may be unsubstituted or substituted with one or more substituents, optionally one or more $R^1$ groups as described above.

The semiconducting polymer may comprise an arylamine repeat unit, optionally a repeat unit of formula (IV):

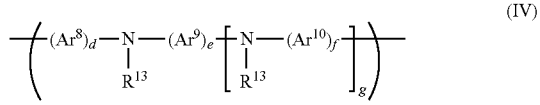
(IV)

wherein $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is a substituent, and d, e and f are each independently 1, 2 or 3.

$R^{13}$, which may be the same or different in each occurrence when g is 1 or 2, is preferably selected from the group consisting of alkyl, optionally $C_{1-20}$ alkyl, $Ar^{11}$ and a branched or linear chain of $Ar^{11}$ groups wherein $Ar^{11}$ in each occurrence is independently substituted or unsubstituted aryl or heteroaryl.

Any two aromatic or heteroaromatic groups selected from $Ar^8$, $Ar^9$, and, if present, $Ar^{10}$ and $Ar^{11}$ that are directly bound to the same N atom may be linked by a direct bond or a divalent linking atom or group. Preferred divalent linking atoms and groups include O, S; substituted N; and substituted C.

$Ar^8$ and $Ar^{10}$ are preferably $C_{6-20}$ aryl, more preferably phenyl, which may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

d e and f are preferably each 1.

$Ar^8$, $Ar^9$, and, if present, $Ar^{10}$ and $Ar^{11}$ are each independently unsubstituted or substituted with one or more, optionally 1, 2, 3 or 4, substituents. Exemplary substituents may be selected from: substituted or unsubstituted alkyl, optionally $C_{1-20}$ alkyl, wherein one or more non-adjacent, non-terminal C atoms may be replaced with optionally substituted aryl or heteroaryl (preferably phenyl), O, S, C=O or —COO— and one or more H atoms may be replaced with F; and cationic groups, for example as described with reference to formula (I).

Preferred substituents of $Ar^8$, $Ar^9$, and, if present, $Ar^{10}$ and $Ar^{11}$ are $C_{1-40}$ hydrocarbyl, preferably $C_{1-20}$ alkyl.

Preferred repeat units of formula (IV) include unsubstituted or substituted units of formulae (IV-1), (IV-2) and (IV-3):

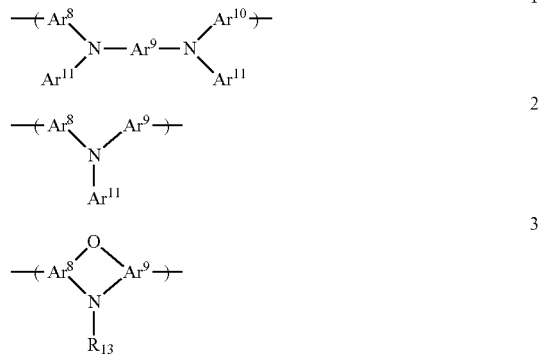

The organic semiconductor has an electron affinity in the range of between about 1.5 and about 4.5 eV, preferably between about 1.8 and about 4.5 eV, more preferably between about 1.8 and about 4 eV, most preferably between about 1.8 and about 3.5 eV. In alternative embodiments, the organic semiconductor has an electron affinity in the range of between about 1.8 and about 3 eV, between about 1.8 and 2.5 eV or between about 1.8 and 2 eV.

The work function obtained is found to lie close to the $E_A$ of the organic material, depending on doping level, anion ratio, nature of organic material, anion and cation, and the processing conditions. Decreasing $E_A$ will tend to make the effective work function ($WF_{eff}$) of the resultant n-doped material smaller, while increasing $E_A$ will tend to make it larger. Without being limited, the organic semiconductor maybe amorphous, semi-crystalline or crystalline.

Such materials including the tethered cation, if any, can be readily prepared by carbon-carbon bond forming chemistry, as well known in the art, including Suzuki coupling, Stille coupling, Yamamoto coupling and aldol condensation.

Donor anion. The electron donor anion is an anion which, in the gas phase, has an electron detachment energy which is less than zero. The electron donor anion can be derived from a material that forms a conjugate acid. The donor anion may be divalent or multivalent. A divalent anion has a valence of two. A multivalent anion has a valence of three or more. Examples of suitable anions include oxalate, malonate, succinate, phosphate, phosphite, sulfite, sulfate, carbonate, ferrocyanide and ferricyanide, their substituted analogues, their analogues covalently bonded to the organic material or a second material, or combinations thereof.

The donor anion may be stabilized by the cation through a Coulombic interaction. For example, a relatively large cation will provide a smaller Coulomb stabilisation to the donor anion compared with a relatively small cation (wherein both the large and small cations have the same charge). This can cause the electron donor level to be shallower. Furthermore, a random disordered ion cluster provides smaller stabilisation of the anions compared to ionic crystals of its salt. Without thereby being limited by theory, the nature, size and electron density of the donor anions modify the morphology and Coulombic interactions within the ionic clusters comprising counter-cations, electron-carrier and optionally excess donor anions and spectator anions in the n-doped material.

The ratio of the number of equivalents of donor anions to the number of equivalents of dopable units of the organic semiconductor is preferably in the range of 0.01-5.

The gas-phase electron donor level of the donor anion, and their hydrated counterparts, can obtained experimentally from photodetachment photoelectron spectroscopies (see for example, Wang et al, J. Chem. Phys., 119 (2003) 3631). The donor level of an anion can be determined rapidly and conveniently from high-quality quantum chemical calculations and is preferably the method used to determine electron donor levels of anions as described herein. An example of such calculations is performed with second-order Møller-Plesset perturbation theory (MP2) using a suitable basis set such as aug-cc-pVTZ to take care of the diffuse portion of the orbital in which the mobile electron resides. These gas-phase values can then be corrected for matrix polarization (e.g. using classical continuum electrostatics in the generalized Born approximation to compute the long-range matrix polarization energy) and electrostatic interaction/relaxation energies (e.g. using PM3 to optimize and compute the local electrostatic interaction/relaxation energies) for different geometries of the ion clusters found in the materials (e.g. MM2 to provide seed molecular dynamic snapshots of the ion clusters in the materials), to give values relevant to the film state. This leads to stabilization of the anion, depending on size of the counter-cation, and of the ion cluster, i.e., number of ions in each cluster. The stabilization energy becomes smaller for smaller ion clusters and larger counter-cation sizes. Further, this also broadens the well-defined gas-phase electron donor levels into diffuse bands. The effective EDL of the donor anion is taken to be upper 1-standard-deviation edge of the inhomogeneously broadened anion band.

As mentioned above, the donor anions may be stabilised in solution. In the solution state, if the electrode potential $E^o$ of the reductant is more negative than the $E^o$ of the organic semiconductor, n-doping of the organic semiconductor occurs. In the solid state, the $E^o$ value in principle can be converted to an effective $E_A$ value by accounting for loss of solvation effects. The donor anion may also be protected in the solid state when the film is still wet. For example, oxalate and sulfate anions have negative gas phase electron detachment energies and have been confirmed by electron detachment experiments to have positive electron detachment energies when hydrated (Wang et al, J. Chem. Phys., 119 (2003) 3631 and Wang et al, J. Chem. Phys., 113 (2000) 10837). Thus, without wishing to be bound by theory, it is believed that the donor anions have positive electron detachment energies when hydrated because of an interaction between the anions and the water molecules.

Spectator anions. The composition may optionally comprise spectator anions. These spectator anions do not donate electrons to the organic semiconductor. The incorporation of spectator anions may be advantageous to modify the electrical and optical properties of the composition.

The spectator anions can be tethered to the organic semiconductor in the form of zwitterion material or alternatively the spectator anions can be untethered. Examples of spectator anions include monoanionic species, for example halides (e.g., $Cl^-$, $Br^-$, $I^-$) and pseudohalides (e.g., $OCN^-$), perchlorate, sulfonates such as fluoroalkyl sulfonates, alkyl sulfonates and phenyl sulfonates, and non-nucleophilic anions including sulfonimides (e.g., bis(perfluoroalkyl) sulfonimide), borates (e.g. tetrafluoroborate, tetraphenylborate, tetrakis(3,5-bis(trifluoromethyl)phenyl)borate (BArF), tetrakis(imidazoyl)borate (Blm4)), hexafluorophosphate and hexafluoroantimonate. Without thereby being limited by theory, the spectator anion may provide enthalpic and entropic contributions to solvation energetics, and hence a degree-of-freedom to improve solubility of the material.

Insertion of anions. The donor and the optional spectator anions can be introduced into the composition according to the following procedures.

An ionic organic semiconductor comprising an anion, such as a spectator anion, may undergo ion exchange with the target anion or anions by any method known to the skilled person, for example: (i) dialysis, (ii) ion-exchange resin, (iii) metathesis or (iv) contact exchange.

In the dialysis method, the material is dissolved in a suitable solvent and kept on one side of a suitable dialysis membrane. A suitable salt of the target anion or anions is dissolved into a suitable solvent and placed either on the same side or opposite side of the membrane. The membrane may be made, for example, of cellulose or polyethersulfone. As dialysis proceeds, the dialysate is refreshed and gradually replaced with pure solvent. In this way, ion exchange takes place and excess ions are removed from the material. The material may be purified by dialysis until the desired ionic purity is obtained, for example sub-1% ionic impurities.

In the ion-exchange resin method, the desired anion is first inserted in the usual way into a suitable ion-exchange resin, which is then placed in contact with the material in solution for the ion exchange to take place.

In the metathesis method, the material is mixed with a suitable salt of the target anion to precipitate an insoluble salt. One way to accomplish this is to prepare the $Ag^+$ salt with the target anion, such as triflate, to react with the original halide, such as a bromide or an iodide, and then remove the silver halide formed by filtration or centrifugation.

In contact exchange, the material with spectator anion is deposited and patterned on the substrate by a suitable method described above, including layer-by-layer polyelectrolyte assembly. In layer-by-layer polyelectrolyte assembly, a polycation and polyanion, either or both comprising the undoped precursor material, are alternately assembled by adsorption on the electrode or substrate to build the film. In addition, a photolithography patterning method may be used. In this method, the film may contain photocrosslinkable moieties which are activated by light that is illuminated through a mask to pattern the film. Alternatively, the film may be patterned by etching or dissolving away areas exposed by a photoresist mask layer that has been fabricated over the film. A suitable salt of the target anion or anions is then dissolved into a suitable solvent that has orthogonal solubility to the film and contacted onto the film for ion-exchange. Excess salt may then be removed by contacting the film with a suitable solvent.

Quantification of the hydration level. The level of hydration of the composition can be quantified by thermogravimetry-mass spectrometry or Raman spectroscopy.

Quantification of the doping level. Preferably, the doping level is between about 0.01 electron per conjugation unit to about 1.0 electron per conjugation unit, more preferably between about 0.4 electron per conjugation unit to about 0.8 electron per conjugation unit. This can be determined by spectrometric titration to observe the absorption spectra evolution of a n-doped semiconductor with increasing amount of n-dopant, until no further changes in the spectra is observed upon addition of more dopant, to establish the size of a conjugation unit. This can be done by, for example, adding a quantitative amount of strong n-dopant to a solution of known amount of organic semiconductor in stepwise, and using UV-Vis spectroscopy to quantify the fractional loss in the absorption band intensity of the π-π* band and rise in the n-doped band intensities, to establish doping of 1.0 electron per conjugation unit. The reference UV-Vis spectrum collected for the n-doped organic semiconductor as described herein can be used to determine the doping level of the organic semiconductor n-doped by the donor anion.

Measurement of $E_A$ and work function. The $E_A$ of the organic semiconductor can be determined by inverse photoemission spectroscopy from the onset of the spectral intensity, as described for example in: J. Hwang et al, J. Phys. Chem. C 111 (2007) 1378-1384 and H. Yoshida, Anal. Bioanal. Chem., 406 (2014) 2231-2237. Work function of the surface of the n-doped semiconductor can be measured in ultraviolet photoemission spectroscopy from the kinetic energies at the Fermi level and the low-energy cut-off of the sample to determine the vacuum level, as described for example in Hwang et al, Mater. Sci. Eng. R 64 (2009) 1. Work function of the n-doped semiconductor layer in device can be measured by inferring from built-in potentials from electroabsorption measurements. An example of a work function measurement of a n-doped semiconductor in device using this method is presented in this disclosure.

Exemplification of selection of anion. The gas-phase electron donor level of an anion is described above. Without thereby limited by theory, the donor anions should preferably have negative gas-phase electron detachment energy, low hydration and distributed charge density for smaller coulombic stabilisation.

Films. A layer comprising or consisting of a composition as described herein may be deposited by any suitable method including, without limitation, deposition from a solution. Deposition from a solution includes printing and coating techniques, for example spin-coating, inkjet printing and lithographic printing. The solvent for solution processing may comprise or consist of one or more solvents, optionally one or more polar solvent materials.

Polar solvent materials may be protic or aprotic. Exemplary protic solvent materials are water and alcohols, for example methanol, ethanol, propanol, butoxyethanol, ethylene glycol, 1-methoxy-2-propanol and monofluoro-, polyfluoro- or perfluoro-alcohols. Exemplary aprotic polar solvent materials have a dielectric constant at 20° C. of at least 15 or at least 20, for example acetonitrile, nitromethane, propylene carbonate, dimethyl sulfoxide, dimethylformamide, N,N-dimethylacetamide, N-methylpyrrolidone and acetone.

A layer comprising or consisting of a composition as described herein may be deposited in air.

The one or more solvent materials may be selected to prevent dissolution of the underlying layer or layers, for example a light-emitting layer of an OLED. Optionally, the composition as described herein is formed on a layer (preferably a light-emitting layer) formed by deposition of a solution in a non-polar solvent.

The film can be deposited by layer-by-layer assembly with one or a plurality of organic materials with different $E_A$ to provide for cascade injection. The layer can also comprise of 2 or more layers of organic materials with different $E_A$ to provide for higher electrical conductivity without compromising on the WF. The film can retain water in ambient and in $N_2$. The amount of water in the film can be determined by thermogravimetric analysis, and Raman and Fourier-transform infrared (FTIR) spectroscopies. As explained previously, the water can stabilise the donor anion.

Devices. An n-doped organic semiconductor formed from a composition as described herein may be used as an electron-injection or electron-extraction layer or an electrode in devices including, without limitation, organic light-emitting diodes; organic photodetectors; organic photovoltaic devices; and organic field-effect transistors; supercapacitors, transducers, actuators and electrochromic devices.

An organic light-emitting device may comprise an anode, a cathode, a light-emitting layer between the anode and cathode and a layer comprising or consisting of an n-doped organic semiconductor between the light-emitting layer and the cathode. One or more further layers may be provided between the anode and cathode, for example hole-injecting, hole-transporting, electron-blocking or hole-blocking layers.

A photoresponsive device, e.g. a photovoltaic device or a photodetector, may comprise an anode, a cathode, a photoactive layer consisting of an electron donor and an electron acceptor between the anode and cathode, wherein the electron donor and electron acceptor may be provided in separate layers or in a bulk heterojunction layer comprising both the electron donor and electron acceptor, and a layer comprising or consisting of an n-doped organic semiconductor between the photoactive layer and the cathode. A photodetector device may be connected to circuitry configured to apply a reverse bias to the device and connected to apparatus configured to measure a photocurrent. A photovoltaic device may be connected to a chargeable battery and/or a load. One or more further layers may be provided between the anode and cathode.

A layer comprising or consisting of the n-doped organic semiconductor in a device may be provided in direct contact with an electrode comprising or consisting of a conductive material having a work function shallower than 4.0 eV, or more preferably shallower than 3.5 eV, for example a layer of aluminium, silver or indium tin oxide (ITO). The electrode may be a cathode of an organic light-emitting device or a photoresponsive device.

A device comprising a layer comprising or consisting of the n-doped organic semiconductor may be provided between an electrode, preferably an electrode having a work function shallower than 3.5 eV, and an organic semiconducting layer. The layer comprising the n-doped organic semiconductor may be directly adjacent to the electrode and the organic semiconducting layer.

In some embodiments, the work function of the n-doped organic semiconductor is no more than 0.5 eV, optionally no more than 0.2 eV, deeper than the electron affinity of the adjacent organic semiconducting layer.

The organic semiconducting layer may be a light-emitting layer of an organic light-emitting diode. In some embodiments, the light-emitting layer comprises a host material and a blue light-emitting material. Optionally, the host material has an electron affinity in the range of about 1.8-2.5 eV.

In some embodiments, the organic light-emitting diode is a white light-emitting device.

The organic semiconducting layer may be a bulk heterojunction layer of a photoresponsive device.

An organic field effect transistor may comprise source and drain electrodes; a gate electrode; a dielectric layer between the gate electrode and the source and drain electrodes; an organic semiconducting layer between the source and drain electrodes and the dielectric layer and extending between the source and drain electrodes; and a layer comprising the n-doped organic semiconductor between the source and drain electrodes and the organic semiconducting layer, not extending between the source and drain electrodes.

The layer comprising the n-doped organic semiconductor may have a thickness of 5 to 100 nm, 10 to 30 nm, or preferably 5 to 30 nm.

Determination of ohmicity of contact. The extent to which an ohmic electron contact is achieved in a diode can be evaluated from the current-voltage characteristics of a set of electron-dominated diodes fabricated with the n-doped organic semiconductor formed from a composition as described herein, and provided with blocking hole contacts, and then modelling the characteristics to determine whether the current is space-charge-limited and/or to determine the electron density at the contact. An ohmic contact is one that is substantially ohmic, yielding a current density preferably at least one-third of the expected space-charge-limited current density. A non-ohmic contact may yield current density less than one-tenth of the expected space-charge-limited current density. The extent to which an ohmic contact is achieved in an organic field effect transistor can be evaluated from extracting the contact resistance using a transfer-line method from a set of organic field effect transistor with various channel lengths, fabricated with the n-doped organic semiconductor formed from a composition as described herein between the source and drain electrodes and the organic semiconducting layer. An ohmic contact may yield a low resistivity of approximately 10 cm$^2$ at the source and drain electrodes. The extent to which an ohmic contact is achieved in an organic photovoltaic device can be evaluated from analysis of the current-voltage characteristics of an organic photovoltaic device fabricated with the n-doped organic semiconductor formed from a composition as described herein, and then modelling with drift-diffusion simulations and current detailed balance analysis to extract the contact resistivity. An ohmic contact may yield a contact resistivity that is about less than half of the bulk resistivity at open-circuit voltage.

DESCRIPTION OF THE DRAWINGS

Scheme 1a. shows the synthesis route of poly(9,9'-bis(3-trimethylammoniopropyl)fluorenyl-2,7-diyl-1,4-phenylene-N-(p-sec-butylphenyl)imino-1,4-phenylene)triflate (F3NMe3-OTf-TFB)

Scheme 1b. shows the synthesis route of poly(9,9'-bis(3-trimethylammoniopropyl)fluorene-2,7-diyl)triflate (F3NMe3-OTf)

Scheme 1c. shows the synthesis route of poly(9,9'-bis(3-trimethylammoniopropyl)fluorenyl-2,7-diyl-benzothiadiazole-2,7-diyl)triflate (F3NMe3-OTf-BT)

Scheme 1d. shows the synthesis route of poly(9,9'-bis(3-(1-methyl)imidaziopropyl)fluorenyl-2,7) bromide (F3Im1-Br)

Scheme 1e. shows the synthesis route of poly(9,9'-bis(3-(1-ethyl)imidaziopropyl)fluorenyl-2,7-diyl-1,4-phenylene-N-(p-sec-butylphenyl)imino-1,4-phenylene) bromide (F3Im2-Br-TFB)

Figure 1:
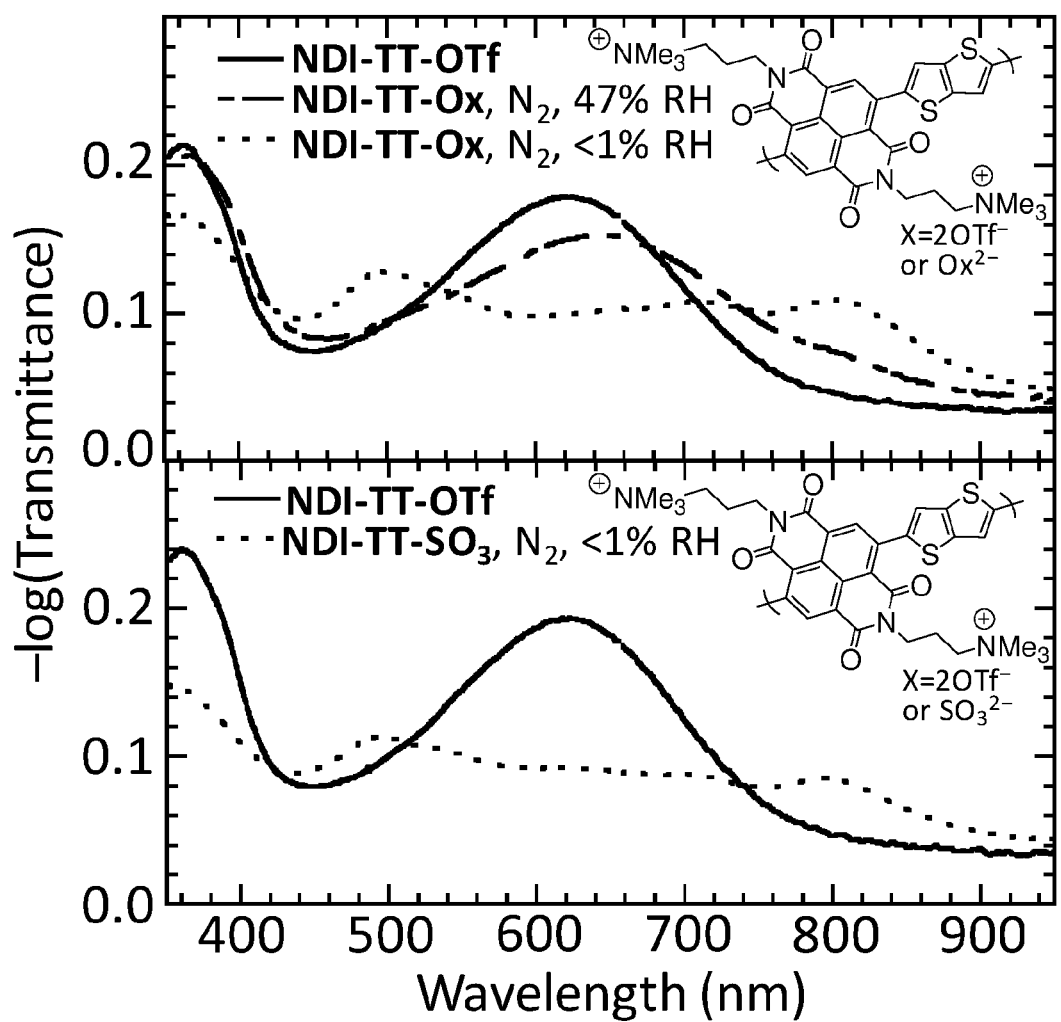

FIG. 1 shows the UV-Vis spectra of undoped NDI-TT-OTf, dehydration-induced n-doped NDI-TT-Ox (top) and NDI-TT-SO3 (bottom). Inset: chemical structure of NDI-TT-X, where X=OTf$^-$, SO$_3^{2-}$ or Ox$^{2-}$.

Figure 2:
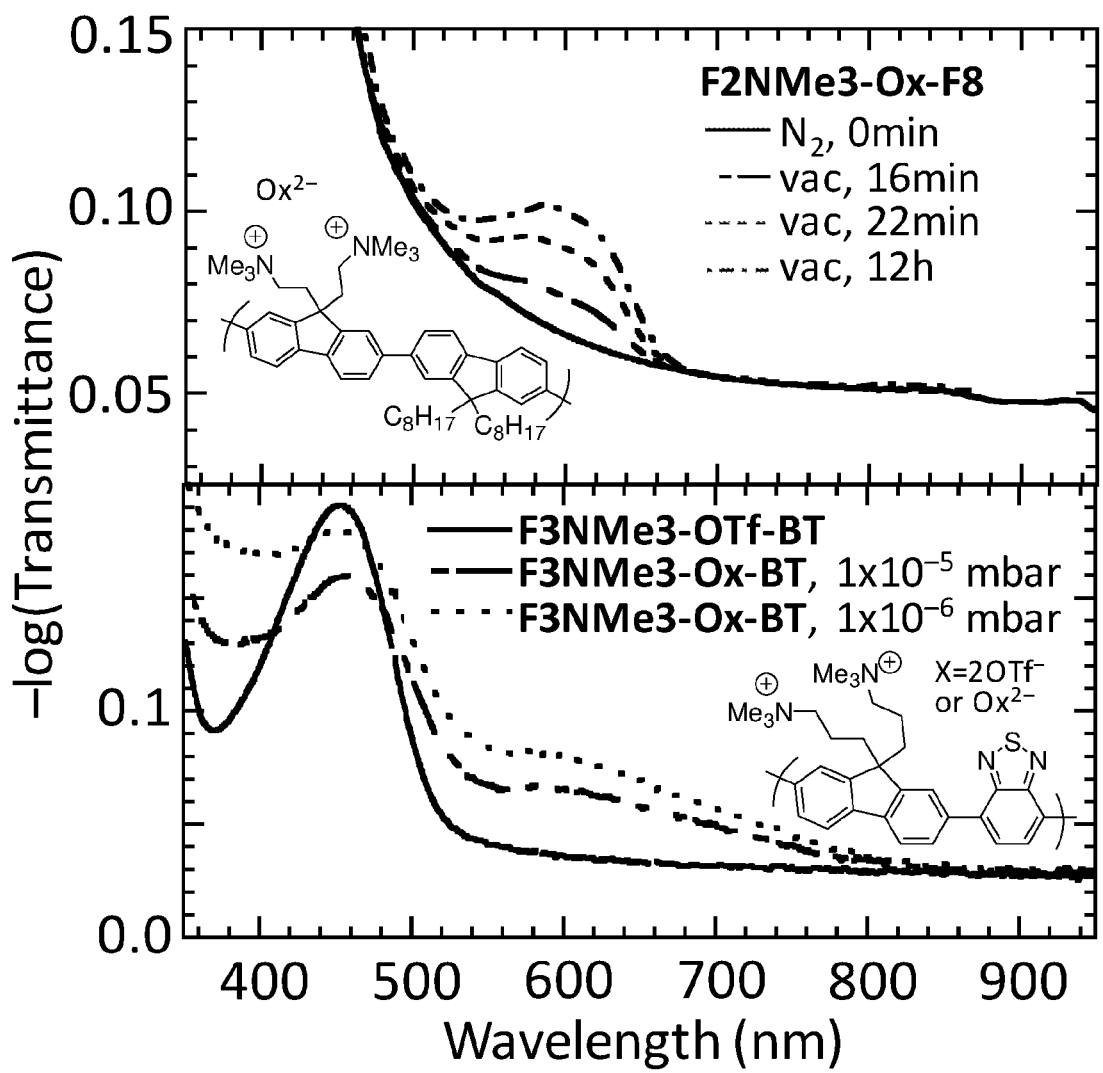

FIG. 2 shows the UV-Vis spectra of dehydration-induced n-doped F2NMe3-Ox-F8 in N$_2$ and in vacuum for different duration (top), and undoped F3NMe3-OTf-BT and dehydration-induced n-doped F3NMe3-Ox-BT (bottom). Inset: chemical structure of F2NMe3-Ox-F8 and F3NMe3-X-BT, where X=OTf$^-$ or Ox$^{2-}$.

Figure 3:
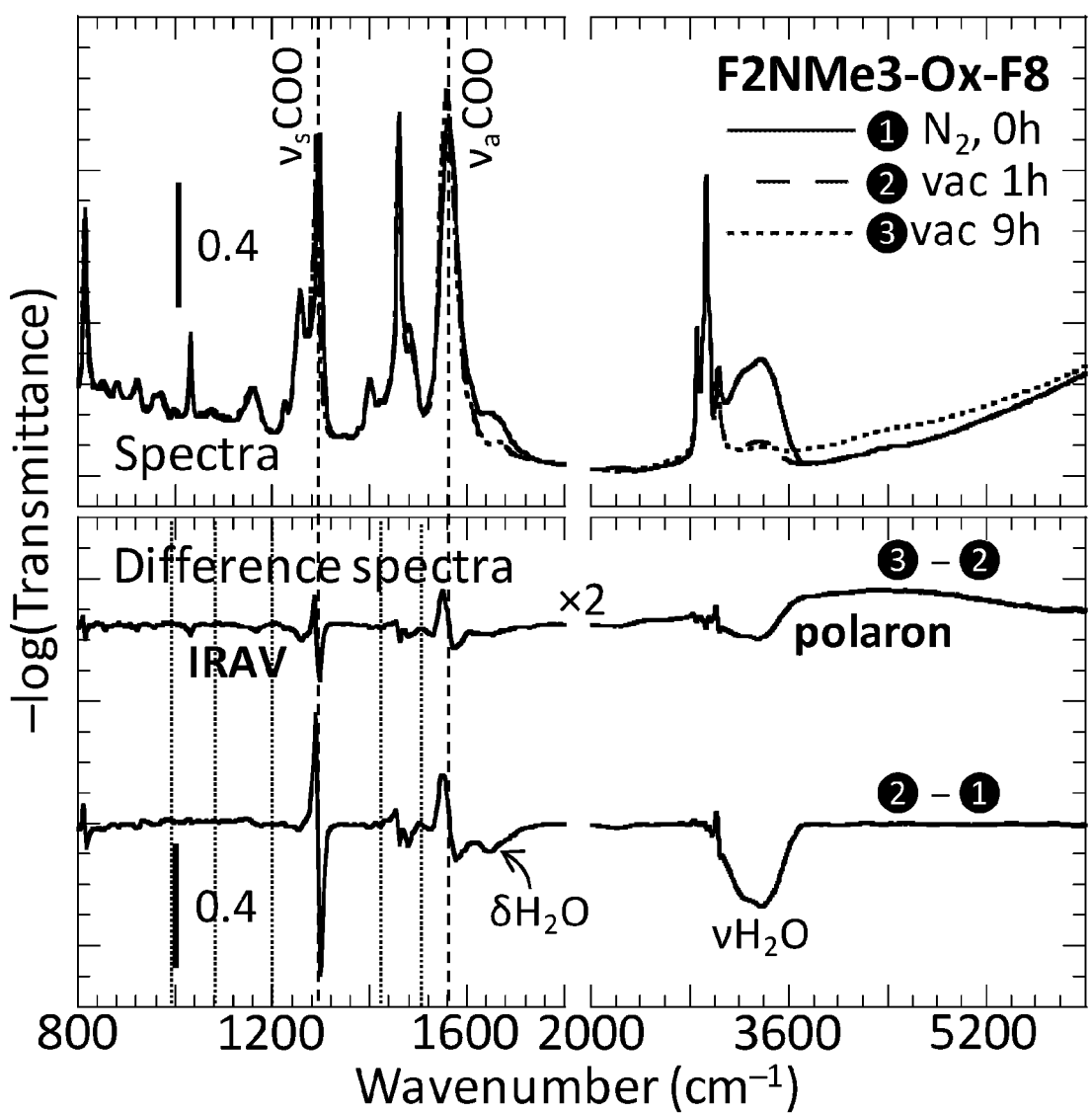

FIG. 3 (top) shows the FTIR spectra of F2NMe3-Ox-F8 immediately after exchange in a N$_2$ chamber and in vacuum. (Bottom) Difference spectra showing dehydration of film and emergence of IRAV band (• • •) with small changes in the Ox features (---) marked out.

Figure 4:
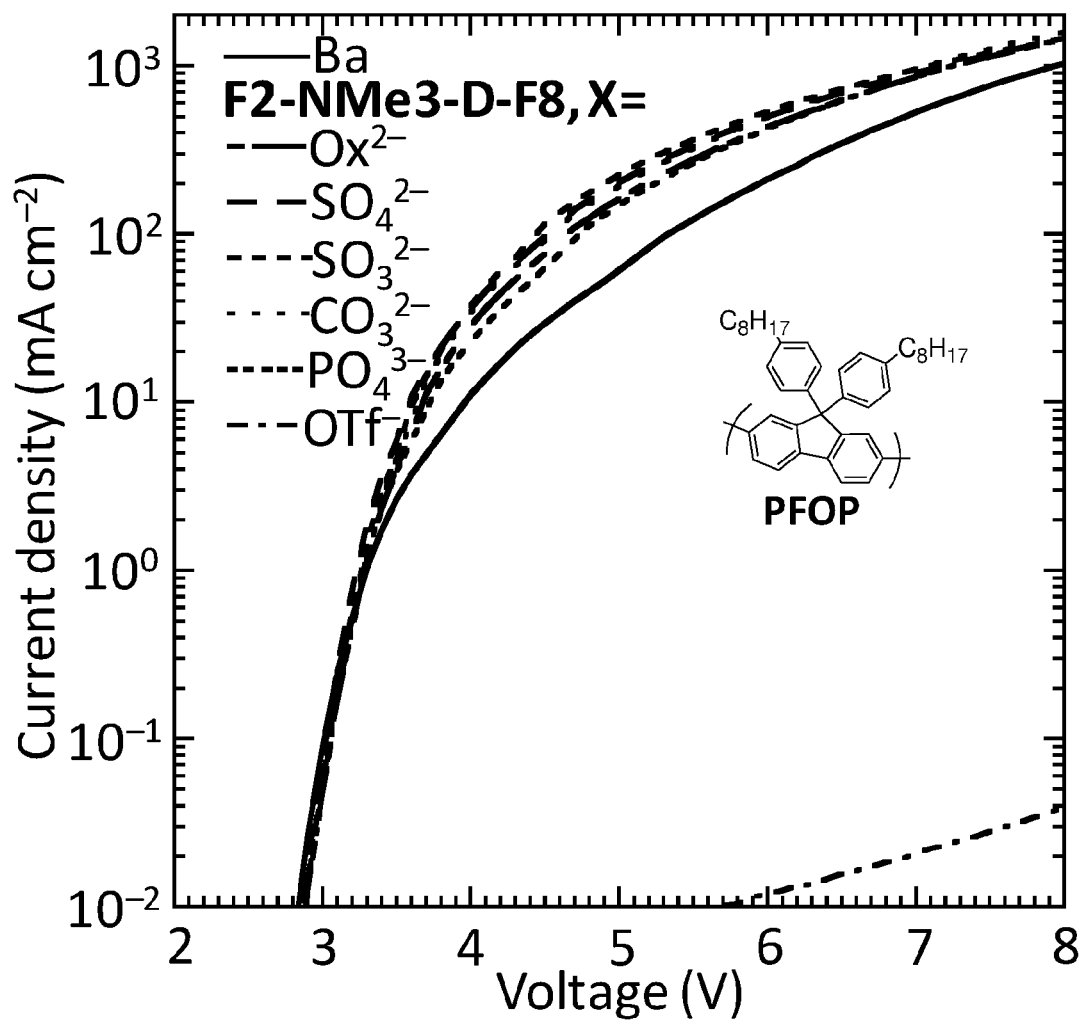

FIG. 4 shows current density-voltage (JV) characteristics of electron-dominated diodes showing ohmic electron injection into poly(9,9-bis(4-octylphenyl)fluorene-2,7-diyl) (PFOP) using F2NMe3-X-F8 as EIL. Device structure: ITO/PEDT:PSSH/PFOP/EIL/Ag, or ITO/PEDT:PSSH/PFOP/Ba/Ag. EIL thickness=10 nm, X=Ox$^{2-}$·SO$_4^{2-}$, SO$_3^{2-}$, CO$_3^{2-}$, PO$_4^{2-}$, or OTf$^-$. Inset: chemical structure of PFOP.

Figure 5:
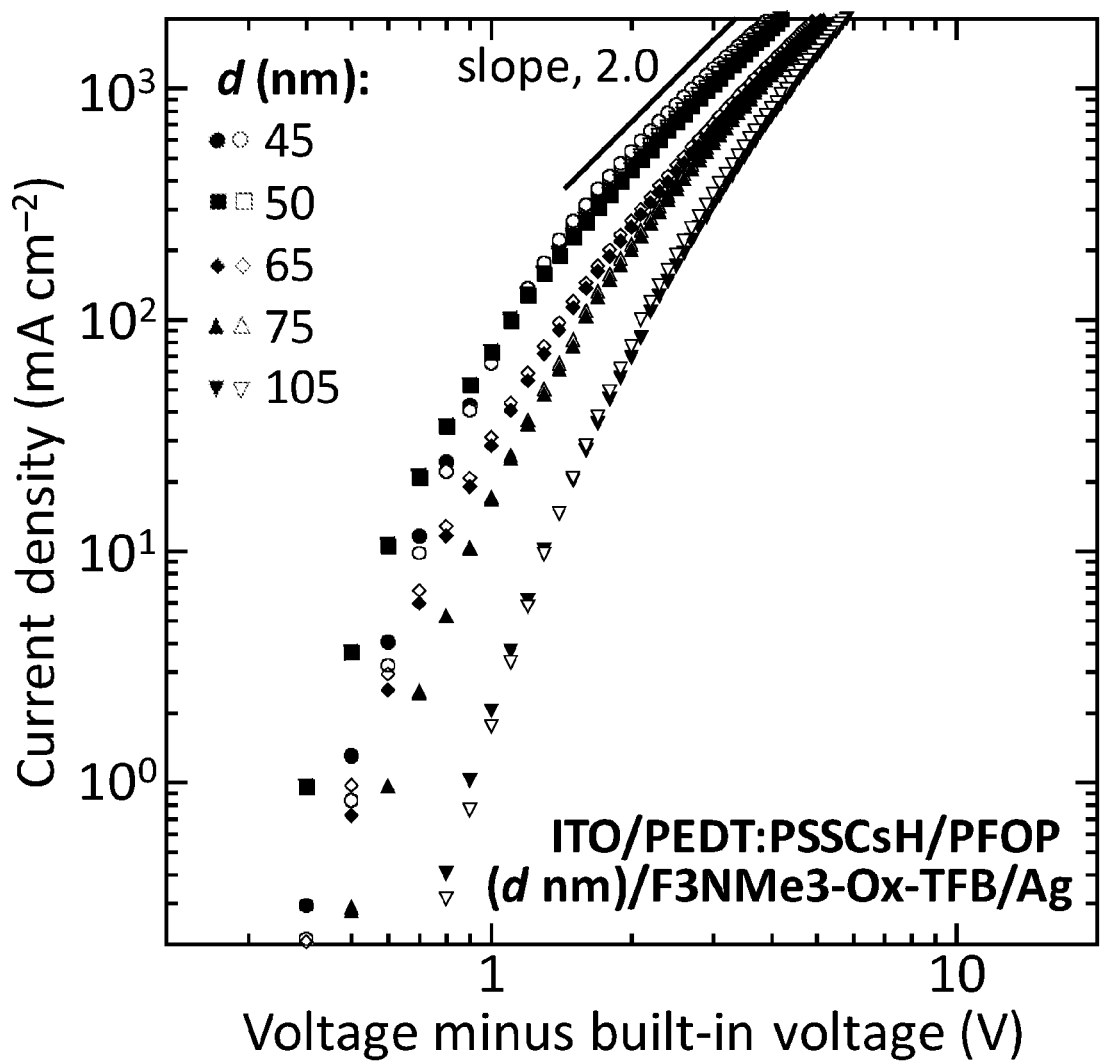

FIG. 5 shows the log J vs log (V− V$_{bi}$) plot of electron-dominated diodes showing electron SCLC in PFOP using F3NMe3-Ox-TFB as EIL. Device structure: ITO/PEDT:PSSCsH/PFOP/EIL/Ag. PFOP thickness=45-105 nm. EIL thickness=10 nm. Data from two representative diodes (solid and open symbols) are plotted for each thickness. Space-charge-limited current behavior is observed at J>300 mA cm$^{-2}$ for thin films.

Figure 6:
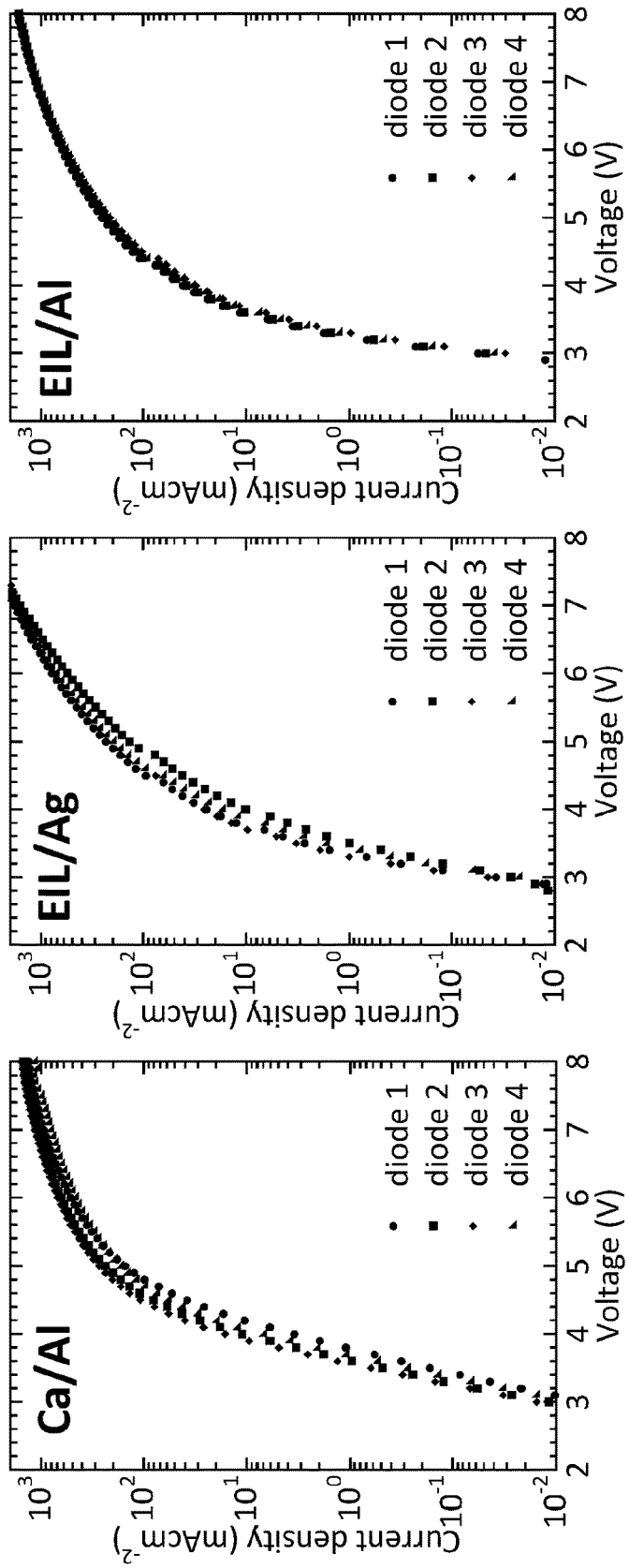

FIG. 6 shows JV characteristics of electron-dominated diodes showing ohmic electron injection into PFOP using F3NMe3-Ox-TFB as EIL. Device structure: ITO/PEDT:PSSH/PFOP/EIL/Ag or Al, or ITO/PEDT:PSSH/PFOP/Ca/Al. EIL thickness=10 nm.

Figure 7:
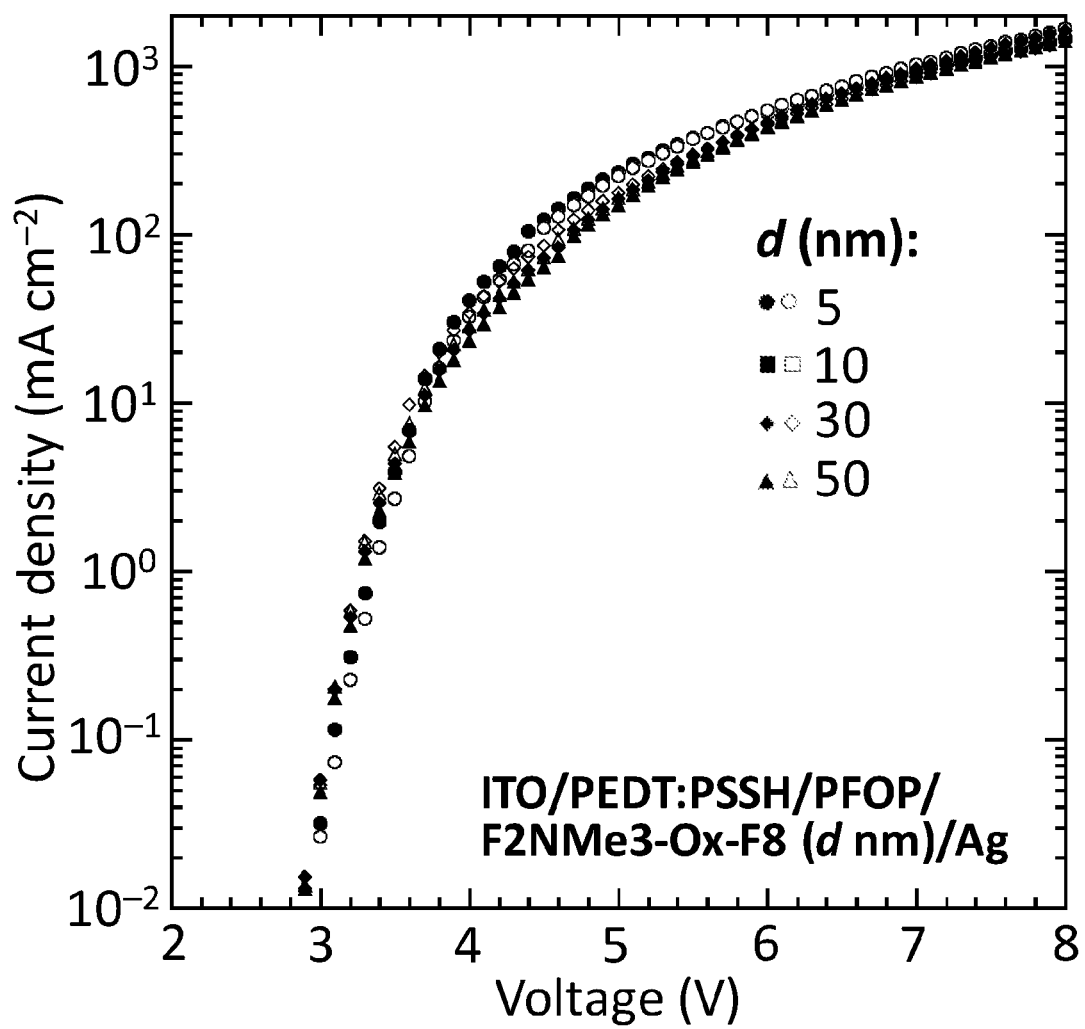

FIG. 7 shows JV characteristics of electron-dominated diodes showing ohmic electron injection into PFOP using F2NMe3-Ox-F8 as EIL. Device structure: ITO/PEDT:PSSH/PFOP/EIL/Ag. EIL thickness=5, 10, 30 and 50 nm.

Figure 8:
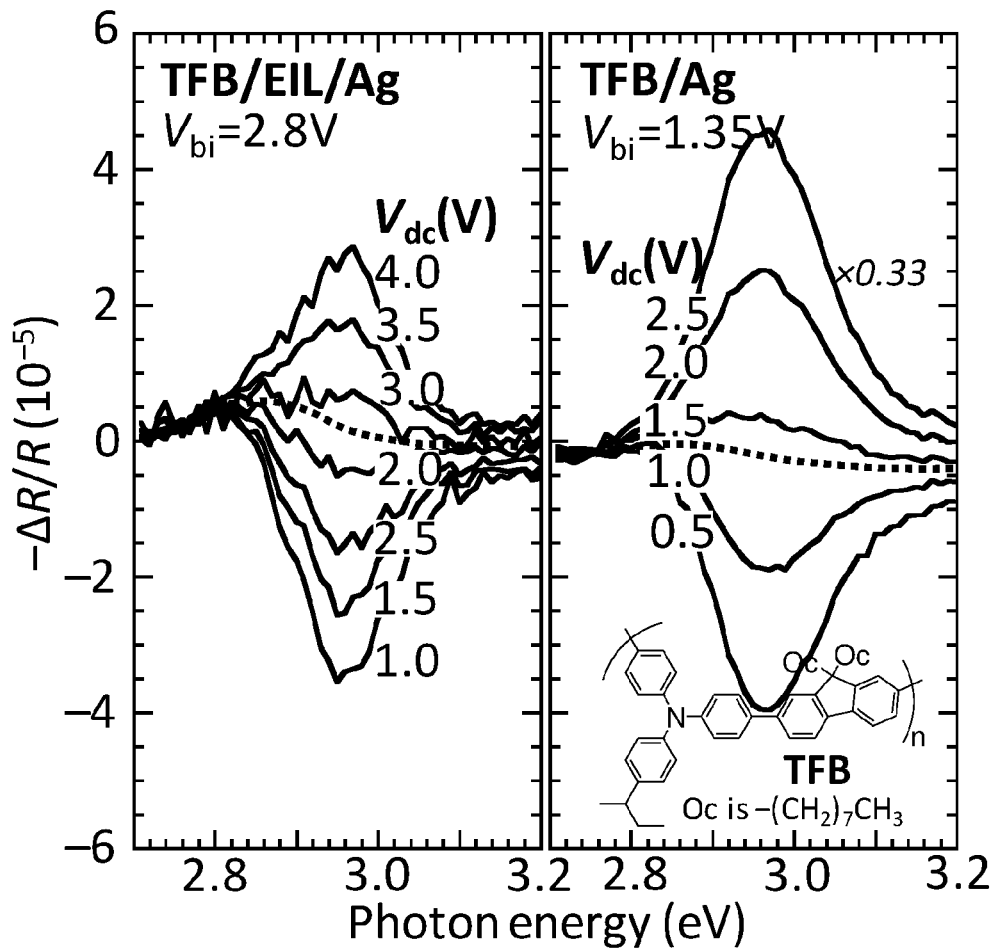
Figure 8:
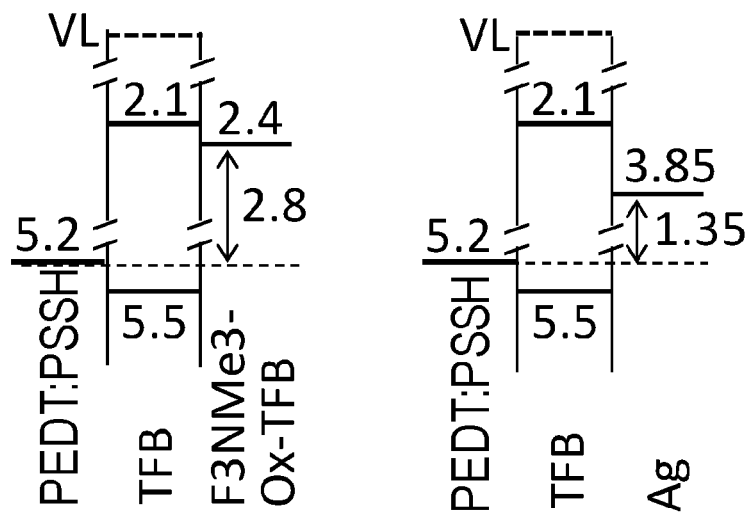

FIG. 8 shows the (top) in-phase electroabsorption spectra, where AR is modulated root-mean-square ac reflectance, and R is dc reflectance, for ITO/PEDT:PSSH/TFB/F3NMe3-Ox-TFB/Ag vs ITO/PEDT:PSSH/TFB/Ag diodes. Upward features correspond to induced absorption in-phase with forward-bias half-cycle. Electroabsorption parameters: temperature, 30 K; ac bias, 0.5 V$_{rms}$; dc bias, 0.5-4.0 V, in steps of 0.5V (on ITO). The dc bias required to attain the null spectrum (dotted lines) gives V$_{bi}$. Inset: chemical structure of TFB. TFB thickness=100 nm. F3NMe3-Ox-TFB thickness=10 nm. (Bottom) Energy-level diagrams plotted relative to vacuum level (VL) of the semiconductor.

Figure 9A:
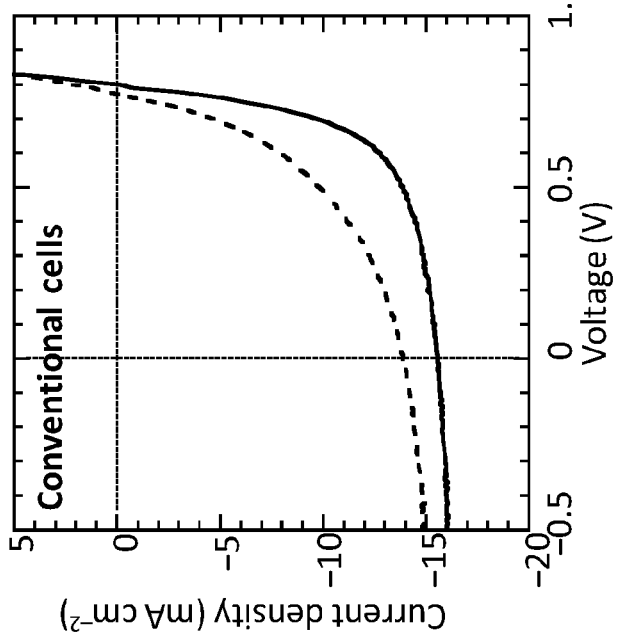
Figure 9B:
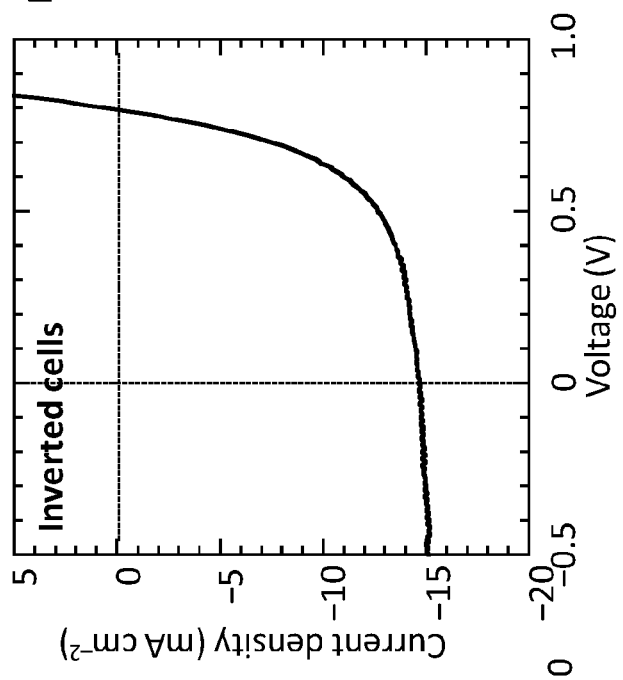
Figure 9C:
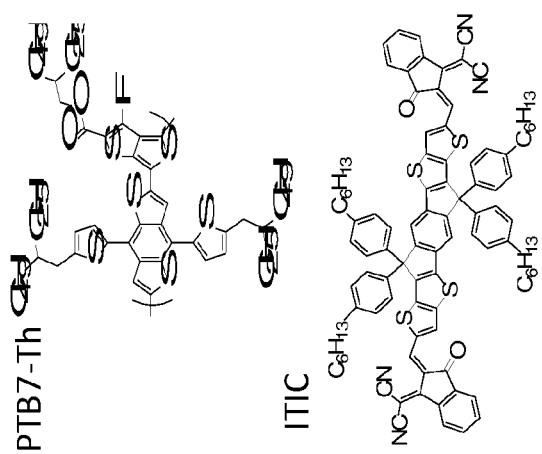

FIG. 9 shows JV characteristics of (A) conventional and (B) inverted solar cells with PTB7-Th:ITIC photoactive layer and F3NMe3-Ox-BT as EIL. Conventional device structure: ITO/hole extraction layer (HEL)/PTB7-Th:ITIC/EIL/Ag (-) or ITO/PEDT:PSSH/PTB7-Th:ITIC/Ca/Al (---). Inverted device structure: ITO/EIL/PTB7-Th:ITIC/HEL/Ag. (C) Chemical structures of PTB7-Th and ITIC.

Figure 10:
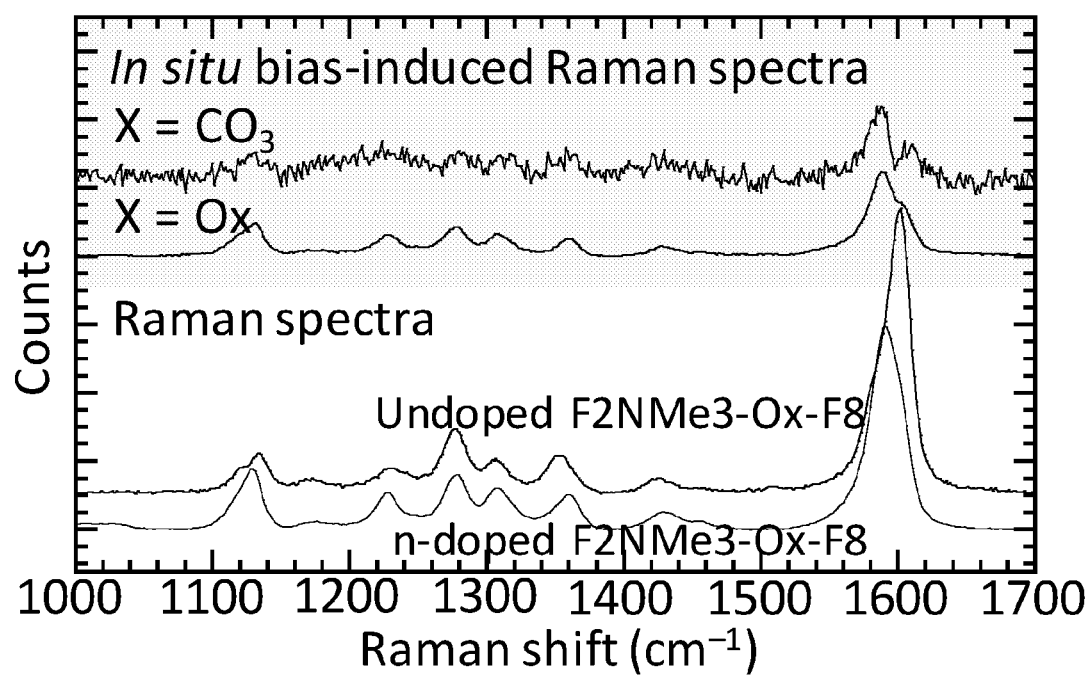

FIG. 10 shows the (top) bias-induced difference Raman spectra for driven and undriven pixels of: ITO/F2NMe3-X-F8/PFOP/MoOx/Ag diodes, where X=Ox$^{2-}$, CO$_3^{2-}$. Difference spectra (driven minus undriven pixel) reveals emergence of red-shifted 1586-cm$^1$ band and new features after brief forward bias. Drive conditions: 0→8→3→0V, twice, N$_2$ glovebox. The devices were encapsulated in N$_2$ for Raman measurements. (Bottom) Reference Raman spectra of an undoped F2NMe3-Ox-F8 film (vacuum 10$^{-4}$ mbar) and a doped F2NMe3-Ox-F8 film (encapsulated in N$_2$). Raman spectra were collected in back-scattered geometry with 633-nm laser excitation through a glass-corrected objective lens (63×; numerical aperture, 0.70).

EXAMPLES

Example 1: Synthesis

Example 1a. Synthesis of poly(9,9'-bis(3-trimethylammoniopropyl)fluorenyl-2,7-diyl-1,4-phenylene-N-(p-sec-butylphenyl)imino-1,4-phenylene)triflate (F3NMe3-OTf-TFB) (Scheme 1a)

9,9'-bis(3-dimethylaminepropyl)fluorenyl-2,7-dibromo (diBr-F3NMe2) (1 equiv) and N,N-Bis[4-(4,4,5,5-tetramethyl-1,3,2-dioxaborolan-2-yl)phenyl]-(p-isobutyl)aniline (diEs-TFB) (1 equiv) and [1,1'-bis(diphenylphosphino)ferrocene]dichloropalladium(II) (Pd(dppf)Cl$_2$) (2 mol %) were added to a microwave vial and purged with argon 3 times. Degassed tetrahydrofuran (THF): dimethylformamide (DMF) (2:1) (25 mg/ml) was added to the microwave vial to dissolve the reactants. Degassed 200 mg/ml sodium carbonate (Na$_2$CO$_3$) (5 equiv) in H$_2$O was added to the microwave vial. The reaction mixture was degassed and stirred for an additional 15 min. The vial was then irradiated by microwave (130° C., 15 min).

The reaction mixture in the microwave vial was dried under vacuum. The resultant solid was dissolved in dichloromethane (DCM) and washed with water. The DCM layer was isolated, and dried under vacuum. The resultant solid was redissolved in THF. The polymer solution was centrifuged and filtered. Sodium diethyldithiocarbamate (70 equiv of Pd(dppf)Cl$_2$) in THF was added to the polymer solution. The polymer poly(9,9'-bis(3-trimethylaminepropyl)fluorenyl-2,7-diyl-1,4-phenylene-N-(p-sec-butylphenyl)imino-1,4-phenylene) (F3NMe2-TFB) solution was filtered and precipitated in diethyl ether (DEE).

F3NMe2-TFB (1 equiv) was added to a one neck round-bottomed flask and purged with argon 3 times. Anhydrous chloroform (CHCl$_3$) was added to dissolve F3NMe2-TFB (20 mg/ml). Methyl trifluoromethanesulfonate (MeOTf) (2.5 equiv) added dropwise to the polymer solution. Precipitation of polymer is observed immediately during addition. The mixture was stirred for 3 hr.

The precipitated polymer was collected by filtration. The precipitate was dissolve in acetonitrile (ACN) and precipitate in toluene. Precipitate was redissolve in ACN to undergo dialysis in ACN. After dialysis, the polymer solution was concentrated before preciptation in DEE to yield off-white F3NMe3-OTf-TFB.

Example 1b. Synthesis of poly(9,9'-bis(3-trimethylammoniopropyl)fluorene-2,7-diyl)triflate (F3NMe3-OTf) (Scheme 1b)

diBr-F3NMe2 (1 equiv) and 2,2'-(9,9-bis(3-dimethylaminopropyl)-9H-fluorene-2,7-diyl)bis(4,4,5,5-tetramethyl-1,3,2-dioxaborolane) (diEs-F3NMe2) (1 equiv) and Pd(dppf)Cl$_2$ (3 mol %) were added to a microwave vial and purged with argon 3 times. Degassed THF:DMF (2:1) (50 mg/ml) was added to the microwave vial to dissolve the reactants. Degassed 200 mg/ml Na$_2$CO$_3$ (5 equiv) in H$_2$O was added to the microwave vial. The reaction mixture was degassed and stirred for an additional 15 min. The vial was then irradiated by microwave (130° C., 15 min).

The reaction mixture in the microwave vial was precipitated in water. The precipitate was redissolved in methanol (MeOH) and sodium diethyldithiocarbamate (70 equiv of Pd(dppf)Cl$_2$) in MeOH was added. The reaction mixture was filtered and the polymer poly(9,9'-bis(3-trimethylaminepropyl)fluorene-2,7-diyl) (F3NMe2) was precipitated in water.

F3NMe2 (1 equiv) was added to a one neck round-bottomed flask and purged with argon 3 times. Anhydrous CHCl$_3$ (20 mg of F$_3$NMe$_2$/ml) was added to dissolve the F3NMe2. MeOTf (2.5 equiv) was added dropwise to the polymer solution. Precipitation of polymer is observed immediately during addition. The mixture was stirred for 3 hr.

The precipitated polymer was collected by filtration. The precipitate was dissolved in ACN and precipitated in toluene. The precipitate was redissolved in ACN to undergo dialysis in ACN. After dialysis, the polymer solution was concentrated before precipitation in DEE to yield white F3NMe3-OTf solids.

Example 1c. Synthesis of Poly(9,9'-Bis(3-Trimethylammoniopropyl)Fluorenyl-2,7-Diyl-Benzothiadiazole-2,7-Diyl)Triflate (F3NMe3-OTf-BT) (Scheme 1c)

4,7-Dibromobenzo[c]-1,2,5-thiadiazole (diBr-BT) (1 equiv) and diEs-F3NMe2 (1 equiv) and Pd(dppf)Cl$_2$ (3 mol %) were added to a microwave vial and purged with argon 3 times. Degassed THF:DMF (2:1) (25 mg/ml) was added to the microwave vial to dissolve the reactants. Degassed 200 mg/ml Na$_2$CO$_3$ (5 equiv) in H$_2$O was added to the microwave vial. The reaction mixture was degassed and stirred for an additional 15 min. The vial was then irradiated by microwave (130° C., 15 min).

The reaction mixture in the microwave vial was dried under vacuum. The solid was dissolved in DCM and washed with water. The DCM layer was isolated, and dried under vacuum. The resultant solid was redissolved in THF. The polymer solution was centrifuged and filtered. Sodium diethyldithiocarbamate (70 equiv of Pd(dppf)Cl$_2$) in THF was added to the polymer solution. The polymer poly(9,9'-bis(3-dimethylaminepropyl)fluorenyl-2,7-diyl-benzothiadiazole-2,7-diyl) (F3NMe2-BT) solution was filtered and precipitated in DEE.

F3NMe2-BT (1 equiv) was added to a one neck round-bottomed flask and purged with argon 3 times. Anhydrous CHCl$_3$ was added to dissolve F3NMe2-BT (20 mg/ml). MeOTf (2.5 equiv) added dropwise to the polymer solution. Precipitation of polymer is observed immediately during addition. The mixture was stirred at room temperature for 3 hr.

The precipitated polymer was collected by filtration. The polymer was dissolved in MeOH and precipitated in toluene. The precipitate was redissolved in MeOH to undergo dialysis in MeOH. After dialysis, the polymer solution was concentrated before precitation in DEE to yield orange F3NMe3-OTf-BT solids.

Example 1d. Synthesis of poly(9,9'-bis(3-(1-methyl)imidaziopropyl)fluorenyl-2,7) bromide (F3Im1-Br) (Scheme 1d)

1-Methyl-imidazole (10 equiv) was added to a solution of 9,9'-bis(3-bromo)fluorenyl-2,7-dibromo (diBr-F3Br) (1 equiv) dissolved in THF (50 mg/ml). The resulting reaction mixture was stirred at 70° C. for two days. After evaporation of the solvent, the crude product was washed with ethyl acetate and DEE to yield 9,9'-bis(3-(1-methyl)imidaziopropyl)fluorenyl-2,7-dibromo bromide.

9,9'-bis(3-(1-methyl)imidaziopropyl)fluorenyl-2,7-dibromo bromide (1 equiv), 2,2'-bipyridine (2.5 equiv), bis(cyclooctadiene)nickel(0) (Ni(COD)$_2$) catalyst (2.5 equiv) and cyclooctadiene (COD) (2.5 equiv) were added to a microwave vial. 50 mg/mL of dry DMF was added to microwave vial to dissolve reaction content and then irradiated by microwave (200° C., 60 min). After completion of the reaction, the solution in the vial was filtered and precipitated in DEE and dried under vacuum to yield a dark brown solid. The solid was dissolved in MeOH to undergo dialysis in MeOH to yield F3Im1-Br solids.

Example 1e. Synthesis of poly(9,9'-bis(3-(1-ethyl) imidaziopropyl)fluorenyl-2,7-diyl-1,4-phenylene-N-(p-sec-butylphenyl)imino-1,4-phenylene) bromide (F3Im2-Br-TFB) (Scheme 1e)

1-ethyl-imidazole (10 equiv)(light sensitive) was added to a solution of diBr-F3Br (1 equiv) dissolved in THE (50 mg/ml). The resulting reaction mixture was stirred at 70° C. for two days in the dark. After evaporation of the solvent, the crude product was washed with ethyl acetate and DEE to yield 9,9'-bis(3-(1-ethyl)imidaziopropyl)fluorenyl-2,7-dibromo bromide.

9,9'-bis(3-(1-ethyl)imidaziopropyl)fluorenyl-2,7-dibromo bromide (1 equiv) and diEs-TFB (1 equiv) and Pd(dppf)Cl$_2$ (3 mol %) were added to a microwave vial. Degassed THF:DMF (2:1) was added to the microwave vial. Degassed 0.6M Na$_2$CO$_3$ (5 equiv) in H$_2$O was added to the microwave vial. The reaction mixture was degassed and stirred for an additional 15 min. The vial was then irradiated by microwave (130° C., 15 min).

The solid in the microwave vial was dissolved in DMF and precipitated in DEE. The precipitate was redissolved in MeOH and sodium diethyldithiocarbamate (20 equiv of Pd(dppf)Cl$_2$) in MeOH was added. The reaction mixture was filtered and precipitated in DEE to yield F3Im2-Br-TFB solids.

Example 2. Ion Exchange

Example 2a. Preparation of poly(9,9'-bis(3-trimethylammoniopropyl)fluorene-2,7-diyl) oxalate (F3NMe3-Ox) by Acid-Based Ion-Exchange F3NMe3-OTf was dissolved in 2,2,2-trifluoroethanol (TFE) at 20 mg/mL and added into 10 equiv of hydroxide resin (pre-conditioned in TFE). The vial was left on a roller for 3 hours. The polymer solution was then filtered through 0.45 μm polypropylene (PP) filter and concentrated with a rotary evaporator. The polymer was dissolved in a minimal amount of MeOH and precipitated in toluene. This was repeated once more. The poly(9,9'-bis(3-trimethylammoniopropyl)fluorene-2,7-diyl) hydroxide (F3NMe3-OH) solids were subsequently washed with DEE, then dried under vacuum for an hour. Oxalic acid (1.2 equiv), dissolved in MeOH at 0.1 M, was added into F3NMe3-OH solids which gradually dissolved. More MeOH was added if there are any undissolved solids, up to 30 mg/mL. The solution was left to stir for 5 min. After evaporation of the solvent, the solids were redissolved in water at 10 mg/mL and dialysed. Water was removed via rotavap and the resultant solids were washed with DEE. The polymer was dried in vacuum for 30 min and redissolved in MeOH or 2,2,3,3,4,4,5,5-octafluoro-1-pentanol (OFP) at 20 mg/mL.

Example 2b. Preparation of poly(9,9'-bis(3-trimethylammonioethyl)fluorenyl-2,7-diyl-1,4-phenylene) (F2NMe3-X-Ph) by Acid-Based Ion-Exchange, where X is an Anion Where X is an oxalate (Ox)(F2NMe3-Ox-Ph): poly(9,9'-bis(3-trimethylammonioethyl)fluorenyl-2,7-diyl-1,4-phenylene) iodide (F2NMe3-I-Ph) was dissolved in TFE at 20 mg/mL and was added into 10 equiv of hydroxide resin (pre-conditioned in TFE). The vial was left on a roller for 3 hours. The polymer solution was then filtered through 0.45 μm PP filter and concentrated with a rotary evaporator. The polymer was dissolved in minimal amount of MeOH and precipitated in toluene twice, before it was washed with DEE. The poly(9,9'-bis(3-trimethylammonioethyl)fluorenyl-2,7-diyl-1,4-phenylene) hydroxide (F2NMe3-OH-Ph) solids dried under vacuum for 1h. Oxalic acid (1.2 equiv), dissolved in MeOH at 0.1M, was added into F2NMe3-OH-Ph solids which gradually dissolves. More MeOH was added, up to ca. 30 mg/ml, if there were any polymer solids that remained undissolved after adding oxalic acid. The solution was left to stir for 5 more mins. The solution was dried. The solids were suspended and stirred vigorously in water at ca. 4 mg/ml before filtering the supernatant to obtain the solids. This was repeated 5 times. Solids were washed with DEE twice. The polymer was dried in vacuum for 30 mins and re-dissolved in MeOH or OFP at 20 mg/mL.

Where X is triflate (OTf) (F2NMe3-OTf-Ph): Triflic acid (1.2 equiv), dissolved in MeOH at 0.1 mmol/mL, was added into F2NMe3-OH-Ph solids which gradually dissolves. More MeOH was added, up to ca. 30 mg/ml, if there were any polymer solids that remained undissolved after adding triflic acid. The solution was left to stir for 5 min. The solution was dried. The solids were suspended and stirred vigorously in water at ca. 4 mg/ml before filtering the supernatant to obtain the solids. This was repeated 5 times. Solids were washed with DEE twice. The polymer was dried in vacuum for 30 min and re-dissolved in MeOH or OFP at 20 mg/mL.

Where X is 1:1 Ox:OTf (F2NMe3-Ox:OTf-Ph). F2NMe3-Ox:OTf-Ph with 1:1 Ox:OTf was prepared by mixing 1:1 F2NMe3-Ox-Ph: F2NMe3-OTf-Ph.

Alternatively F2NMe3-Ox:OTf-Ph with 1:1 Ox:OTf can be prepared by adding stoichiometric amount of 1:1 oxalic acid: triflic acid to F2NMe3-OH-Ph for acid-base reaction.

Example 2c. Preparation of F3NMe3-SO$_4$-TFB by Ion-Exchange Resins

Clean hydroxide resins were conditioned with sodium sulfate (Na$_2$SO$_4$) solution and rinsed with water, followed by 1:1 MeOH: ACN. F3NMe3-OTf-TFB was dissolved in MeOH:ACN (1:1) at 10 mg/mL and added into 10 equiv of Na$_2$SO$_4$ conditioned resin and rolled overnight. The polymer solution was concentrated and precipitated in toluene and washed in DEE. The polymer solid was washed with water, followed by DEE. The polymer solids were dried under vacuum. F3NMe3-OTF:SO$_4$-TFB is soluble in a MeOH: ACN mixture but not MeOH or ACN only.

Example 2d. Preparation of poly(9,9'-bis(3-trimethylammonioethyl)fluorene-2,7-diyl-9,9-dioctylfluorene-2,7-diyl) (F2NMe3-X-F8) by Contact-Exchange, where X is an Anion poly(9,9'-bis(3-trimethylammonioethyl)fluorene-2,7-diyl-9,9-dioctylfluorene-2,7-diyl)triflate (F2NMe3-OTf-F8) was dissolved in OFP to give 5 mg/mL solution. The solution was spin-cast on O$_2$-plasma cleaned quartz substrates to give 10-nm-thick films. The films were contacted with 80 mM salt solution of X in water or other solvents or solvent mixtures then spin off. This was followed by a spin-wash step with water or other solvents or solvent mixtures.

Example 3: UV-Vis n-Doped Spectra

Example 3a: Optical spectra of n-doped poly[N,N-bis(3-trimethylammoniopropyl)-1,4,5,8-napthalenedicarboximide-2,6-diyl]-alt-5,5'-(thieno[3,2-b]thiophene) oxalate (NDI-TT-Ox) and sulfite (NDI-TT-SO$_3$)

poly[N,N-bis(3-trimethylammoniopropyl)-1,4,5,8-napthalenedicarboximide-2,6-diyl]-alt-5,5'-(thieno[3,2-b]thiophene)triflate (NDI-TT-OTf) was dissolved in TFE to give 10 mg/mL solution. The solution was spin-cast in the ambient on an 02-plasma cleaned quartz substrate to give a 37-nm-thick film. The film was then brought into a N$_2$ glovebag at 47% relative humidity (RH) for UV-Vis measurement. The film was subsequently brought out into the ambient and contacted with 80 mM sodium oxalate solution in water, in air, then spin off. This was followed by a spin-wash step with water. UV-Vis measurement of the NDI-TT-Ox film was performed, in N$_2$ glovebag at 47% RH, after the contact-exchange. The film was then brought into a N$_2$ glovebox, <1% RH, for a subsequent UV-Vis measurement.

FIG. 1 (top) shows the UV-vis spectra of NDI-TT-OTf, NDI-TT-Ox (N$_2$ 47% RH) and NDI-TT-Ox (N$_2$<1% RH).

NDI-TT-OTf was dissolved in TFE to give 10 mg/mL solution. The solution was spin-cast on a O$_2$-plasma cleaned quartz substrate to give a 37-nm-thick film. The film was then brought into a N$_2$ glovebox, <1% RH, for UV-Vis measurement. The film was then contacted with 80 mM sodium sulfite solution in water, in the N$_2$ glovebox, then spin off. This was followed by a spin-wash step with water. UV-Vis measurement of the NDI-TT-SO$_3$ film was performed, in N$_2$ glovebox, after the contact-exchange.

FIG. 1 (bottom) shows the UV-vis spectra of NDI-TT-OTf and NDI-TT-SO$_3$ (N$_2$<1% RH).

The figure illustrates one mode of in situ activation of the electron doping for the donor anions, providing ground-state electron doping of organic semiconductors upon dehydration. When the films were transferred into a N$_2$ chamber with 47% RH (regulated by saturated salt solutions), the film turns brown and its optical spectrum reveals spontaneous n-doping. As the RH is further decreased towards 0% (pH$_2$O<300 ppm), n-doping becomes complete.

Example 3b: Optical Spectra of n-Doped F2NMe3-Ox-F8 and F3NMe3-Ox-BT

F2NMe3-OTf-F8 was dissolved in OFP to give 20 mg/mL solution. The solution was spin-cast in the ambient on O$_2$-plasma cleaned quartz substrates to give 260-nm-thick films. Subsequently, the film was contacted with 80 mM sodium oxalate solution, dissolved in 1:4 MeOH:H$_2$O, in the dark then spin off. This was followed by a spin-wash step with water. The poly(9,9'-bis(3-trimethylammonioethyl)fluorene-2,7-diyl-9,9-dioctylfluorene-2,7-diyl) oxalate (F2NMe3-Ox-F8) film was then transferred into a vacuum chamber and pumped up to 10$^{-6}$ mbar for UV-Vis measurement.

FIG. 2 (top) shows the UV-vis spectra of F2NMe3-Ox-F8 (N$_2$; vacuum 10$^{-5}$-10$^{-6}$ mbar for up to 12h) indicating a doping density of ca. 0.06 electrons per conjugation unit of F2NMe3-Ox-F8 at 1×10$^{-6}$ mbar.

The figure illustrates electron doping for the oxalate anion, providing ground-state electron doping of polyfluorene core upon dehydration. Spontaneous electron doping occurs only under high vacuum conditions.

F3NMe3-OTf-BT was dissolved in OFP to give 5 mg/mL solution. The solution was spin-cast in the ambient on 02-plasma cleaned quartz substrates to give 19-nm-thick film. The film was then transferred into a vacuum chamber fitted with quartz window for UV-Vis measurement in air. Subsequently, the films was contacted with 80 mM sodium oxalate solution, dissolved in 1:4 MeOH:H$_2$O, in the dark then spin off. This was followed by a spin-wash step with water. The film was then transferred into a vacuum chamber and pumped up to 10$^{-6}$ mbar for UV-Vis measurement.

FIG. 2 (bottom) shows the UV-vis spectra of F3NMe3-OTf-BT and F3NMe3-Ox-BT (1×10$^{-5}$ mbar; 1×10$^{-6}$ mbar) indicating a doping density of 0.2 electrons per conjugation unit of F3NMe3-Ox-BT demonstrating spontaneous electron doping upon dehydration.

Example 4. FTIR Spectra of Dehydration-Induced n-Doped F2NMe3-Ox-F8

F2NMe3-OTf-F8 was dissolved in OFP to give 20 mg/mL solution. The solution was drop-cast in the ambient on 02-plasma cleaned intrinsic silicon substrates to give 1.2-μm-thick films. The film was then transferred into a N$_2$-filled vacuum chamber fitted with potassium bromide (KBr) windows for FTIR measurement and pumped up to 10$^{-6}$ mbar for FTIR measurements.

FIG. 3 (top) shows the FTIR spectra of F2NMe3-Ox-F8 (N$_2$ at 1 bar; vacuum 10$^{-5}$-10$^{-6}$ mbar for up to 9h). The difference spectrum (FIG. 3, bottom) shows dehydration of the film and emergence of IRAV band with small changes in the Ox features.

Example 5. Improved Device Performances

Examples are outlined below to illustrate the improvements in electron-injection performance.

Example 5a. Electron Injection from Ag Through F2NMe3-X-F8, where X=Donor Anions 30-nm-thick poly(3,4-ethylenedioxythiophene): poly(styrenesulfonic acid) (PEDT:PSSH) (1:6) polymer films were spun in air on O$_2$ plasma-cleaned ITO substrates and annealed (140° C., 15 min) in a N$_2$ glovebox. 100-nm-thick host material poly(9,9-bis(4-octylphenyl)fluorene-2,7-diyl) (PFOP) from toluene was then spin-cast over the PEDT:PSSH film. 10-nm-thick F2NMe3-OTf-F8 electron injection layer (EIL) was spin-cast on PFOP and contact-exchanged to oxalate (Ox$^{2-}$), sulfite (SO$_3^{2-}$), sulfate (SO$_4^{2-}$), carbonate (CO$_3^{2-}$), or phosphate (PO$_4^{3-}$) anion as described in Example 2d. Devices were completed with the evaporation of a silver cathode.

FIG. 4 shows the J-V characteristics of the devices with F2NMe3-Ox-F8, F2NMe3-SO$_3$—F8, F2NMe3-SO$_4$—F8, F2NMe3-CO$_3$—F8, F2NMe3-PO$_4$—F8 and F2NMe3-OTf-F8 as the EIL, and the reference Ba device. All devices except possibly for OTf$^-$ are electron-dominated. The di-anions and tri-anion clearly lead to stronger electron injection than Ba.

Example 5b. Electron Space-Charge-Limited-Current (SCLC) in PFOP with F3NMe3-Ox-TFB 20-nm-thick poly(3,4-ethylenedioxythiophene): poly(styrenesulfonate) polymers with mixed caesium and hydrogen cations (PEDT:PSSCsH) (1:6) polymer films were spun in air on O$_2$ plasma-cleaned ITO substrates and annealed (140° C., 15 min) in a N$_2$ glovebox. Variable thicknesses of host material poly(9,9-bis(4-octylphenyl)fluorene-2,7-diyl) (PFOP) from toluene was then spin-cast over the PEDT:PSSCsH film. 10-nm-thick F3NMe3-OTf-TFB electron injection layer (EIL) was spin-cast on PFOP and contact-exchanged to oxalate (Ox$^{2-}$) as described in Example 2d. Devices were completed with the evaporation of a silver cathode.

PEDT:PSSCsH, with an even lower work function than PEDT:PSSH, was used as electron exit contact to further reduce the hole current contribution into PFOP.

FIG. 5 shows the log J vs log (V–V$_{bi}$) plot of the devices, where V$_{bi}$ is the diode built-in potential measured by electroabsorption spectroscopy. A classic signature of trap-free SCLC: J∝(V–V$_{bi}$)$^n$, with n=2 for J≥300 mA cm$^{-2}$ was observed for PFOP films thinner than 100 nm.

Example 5c. Electron Injection from F3NMe3-Ox-TFB Capped with Ag or Al 30-nm-thick PEDT:PSSH (1:6) polymer films were spun in air on 02 plasma-cleaned ITO substrates and annealed (140° C., 15 min) in N$_2$ glovebox. 90-nm-thick host material PFOP from toluene was then spin-cast over the PEDT:PSSH film. 10-nm-thick F3NMe3-OTf-TFB film was spin-cast on PFOP and contact-exchanged to oxalate anion. An example of the contact-exchange procedure is described in Example 2d. Devices were completed with the evaporation of Ag or Al.

Device without EIL capped with Ca/Al was fabricated as reference.

F3NMe3-Ox-TFB capped with Ag give electron current density similar to the reference (FIG. 5 left vs middle panel).

F3NMe3Ox-TFB capped with Al give electron current density similar to the reference (FIG. 5 left vs right panel).

Calcium of the reference device has a work function much closer to the LUMO of PFOP than that of silver or aluminium, however the use of an electron-injection layer formed from the oxalate-containing polymer has a similar current density to the calcium-containing device.

Example 5d. Electron Injection from Deep Work Function Ag Through Thick n-Doped EIL 30-nm-thick PEDT:PSSH (1:6) polymer films were spun in air on O$_2$ plasma-cleaned ITO substrates and annealed (140° C., 15 min) in N$_2$ glovebox. 90-nm-thick host material PFOP from toluene was then spin-cast over the PEDT:PSSH film. 5, 10, 30 and 50-nm-thick F2NMe3-OTf-F8 films were spin-cast on PFOP and contact-exchanged to oxalate anion as described in Example 2d. Devices were completed with the evaporation of Ag.

EIL with increase thickness up to 50 nm gave similar current density. (FIG. 7) The thickness invariance reveals the F2NMe3-OTf-F8 is sufficiently conductive.

Example 5e. Effective Work Function of F3NMe3-Ox-TFB in Device 30-nm-thick PEDT:PSSH (1:6) polymer films were spun in air on O$_2$ plasma-cleaned ITO substrates and annealed (140° C., 15 min) in N$_2$ glovebox. 100-nm-thick host material poly[2,7-(9,9-di-n-octylfluorenediyl)-alt-(1,4-phenylene-(4-sec-butylphenylimino)-1,4-phenylene)](TFB) from toluene was then spin-cast over the PEDT:PSSH film. 10-nm-thick F3NMe3-OTf-TFB EIL was spin-cast on PFOP and contact-exchanged to oxalate (Ox$^{2-}$) as described in Example 2d. Devices were completed with the evaporation of a silver cathode.

Device without EIL capped with Ag was fabricated as references.

FIG. 8 (top) shows the bias-dependent in-phase electroabsorption spectra for diodes with and without F3NMe3-OTf-TFB. The V$_{bi}$ is given by the dc bias required to null out the Stark absorption spectrum. In the presence of F3NMe3-OTf-TFB, the V$_{bi}$ for the TFB diode is 2.8 V, confirming the effective work function of N3-Ox to be 2.4=0.1 eV (FIG. 8, bottom). Without N3-Ox, V$_{bi}$ is 1.35 V, close to the expected difference in effective work functions between Ag (3.7 f 0.1 eV) and PEDT:PSSH (5.2 f 0.1 eV).

Example 5f. Electron Extraction with F3NMe3-Ox-BT

Conventional cells. Self-compensated hole-doped triarylamine-fluorene copolymer films as a hole extraction layer (HEL) were spun on O$_2$ plasma-cleaned ITO substrates in N$_2$ glovebox. 100-nm-thick 1:1.2 poly([2,6'-4,8-di(5-ethylhexylthienyl)benzo[1,2-b; 3,3-b]dithiophene]{3-fluoro-2 [(2-ethylhexyl)carbonyl]thieno[3,4-b]thiophenediyl}): 2,2'-[[6,6,12,12-Tetrakis(4-hexylphenyl)-6,12-dihydrodithieno [2,3-d:2',3'-d']-s-indaceno[1,2-b:5,6-b']dithiophene-2,8-diyl]bis[methylidyne(3-oxo-1H-indene-2,1(3H)-diylidene)]]bis[propanedinitrile](PTB7-Th:ITIC) photoactive layer (PAL) from dichlorobenzene was then spin-cast over the PEDT:PSSH film. 20-nm-thick F3NMe3-OTf-BT film was spin-cast on the PAL and contact-exchanged to oxalate anion as described in Example 2d. Devices were completed with the evaporation of Ag.

Control device with PEDT:PSSH as HCL and Ca/Al as electron contact was fabricated.

Inverted cells. 20-nm-thick F3NMe3-OTf-BT film was spin-cast in air on 02 plasma-cleaned ITO substrates in N$_2$ glovebox and contact-exchanged to oxalate anion as described in Example 2d. 100-nm-thick 1:1.2 PTB7-Th:ITIC PAL from dichlorobenzene was then spin-cast over the EIL film. Self-compensated hole-doped triarylamine-fluorene copolymer films were spin-cast on PAL. Devices were completed with the evaporation of Ag.

All devices were measured under 100 mW cm$^{-2}$ illumination with the simulated AM1.5 spectral output on an Oriel Sol2A solar simulator.

FIG. 9 shows the J-V characteristics of the (A) conventional cells, (B) inverted cells and (C) chemical structure of the donor PTB7-Th and the acceptor ITIC.

The ITO/HEL/PAL/F3NMe3-OTf-BT/Ag device clear shows superior performance than the reference ITO/PEDT:PSSH/PAL/Ca/Al device. The improved fill factor is a signature of reduced contact resistance in highly ohmic contacts. The advantage of solution-processability of the HEL and F3NMe3-OTf-BT allows for solar cells to be fabricated in both conventional and inverted structures.

Example 6. Raman Spectra of Electroactivated n-Doped F2NMe3-Ox-F8 in Device 10-nm-thick F2NMe3-OTf-F8 film was spin-cast in air on O$_2$ plasma-cleaned ITO substrates and contact-exchanged to either oxalate or carbonate anion. An example of the contact-exchange procedure is described in Example 2d. 60-nm-thick host material PFOP from toluene was then spin-cast over the F2NMe3-X-F8film, where X=Ox$^{2-}$ or CO$_3^{2-}$, in a $N_2$ glovebox. Devices were completed with the evaporation of 5-nm-thick molybdenum oxide (MoOx) and capped with Ag.

A voltage bias on the ITO, 0V→8V→−3V→0V over a period of 8s, was performed twice on one of the pixel from each device in the $N_2$ glovebox. The devices were subsequently encapsulated in $N_2$ for Raman measurements.

Two 120-nm-thick F2NMe3-OTf-F8 films were spin-cast in air on $O_2$ plasma-cleaned quartz substrates and contact-exchanged to oxalate anion. An example of the contact-exchange procedure is described in Example 2d. One of the films was loaded into a vacuum chamber for Raman measurement. The other film was evaporated with Ag at a base pressure of $10^{-6}$ torr, followed by encapsulation in $N_2$ to give a n-doped F2NMe3-OTf-F8 film.

Unpolarised Raman spectra of a driven and an undriven pixel from each device, an undoped F2NMe3-Ox-F8 film (vacuum $10^{-4}$ mbar), and a n-doped F2NMe3-OTf-F8 film were collected using back-scattered geometry with 633 nm excitation source focused through a glass correctional objective lens (numerical aperture 0.70, 63×).

FIG. 10 that shows that the bias-induced difference Raman spectra of driven and undriven pixels of ITO/F2NMe3-X-F8/PFOP/MoOx/Ag diode, where X=$Ox^{2-}$ or $CO_3^{2-}$, reveals emergence of red-shifted 1586 $cm^{-1}$ band and new features attributing to an n-doped F2NMe3-X-F8 after brief forward bias.

Schemes

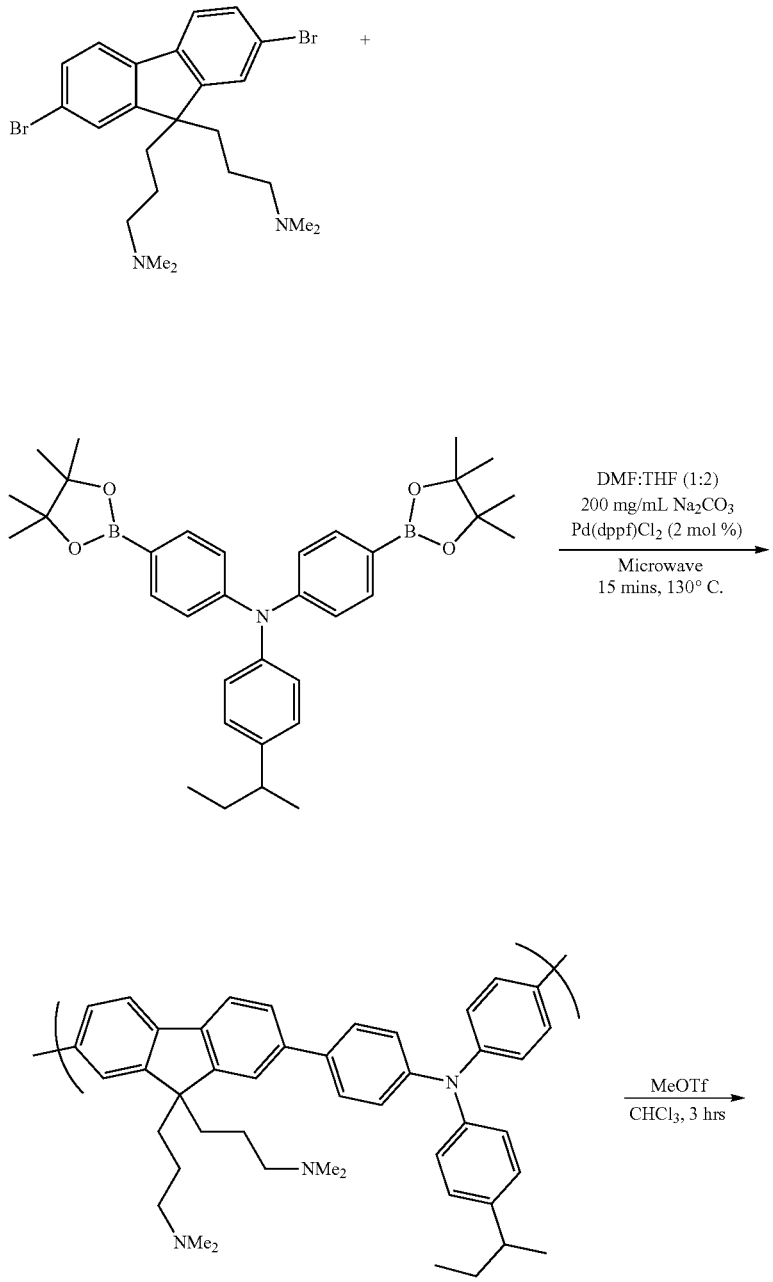

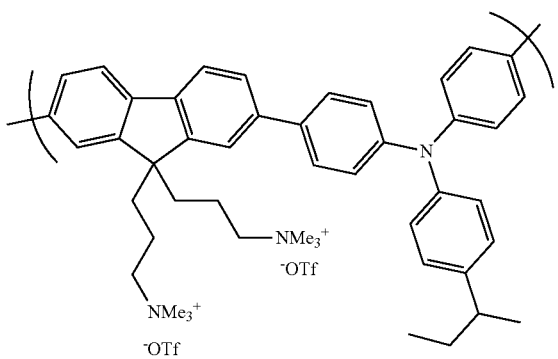
Scheme 1b
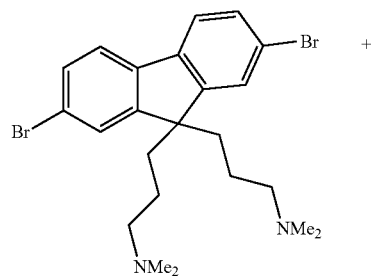
+
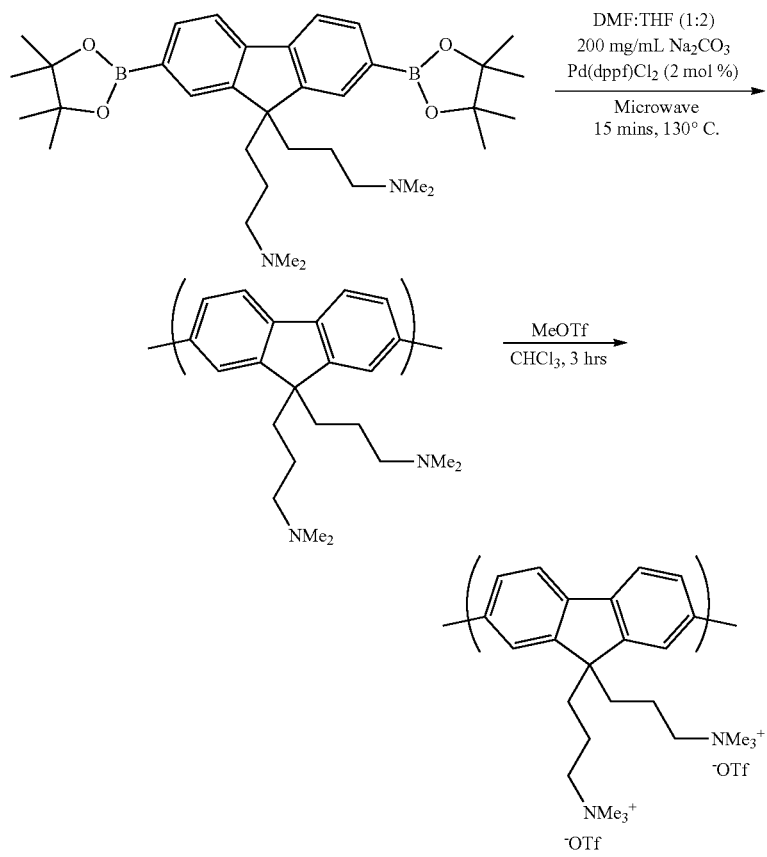

Scheme 1c
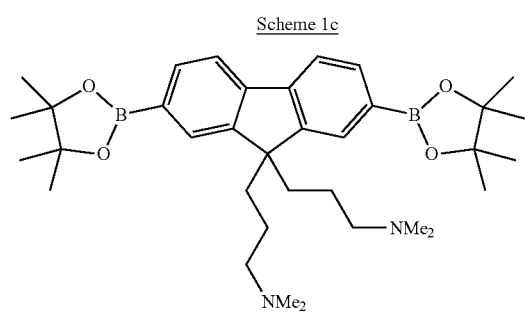
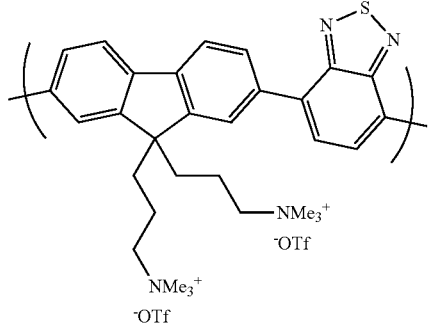
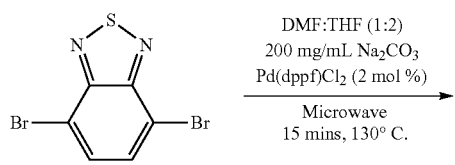
Scheme 1d
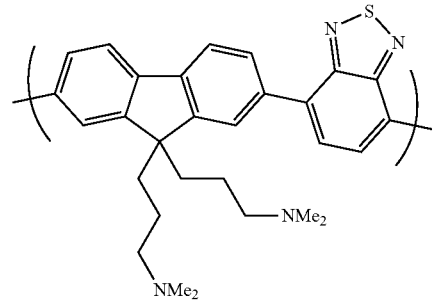
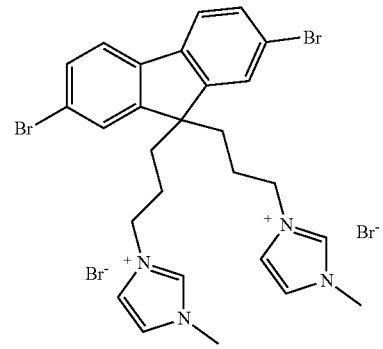
Scheme 1e
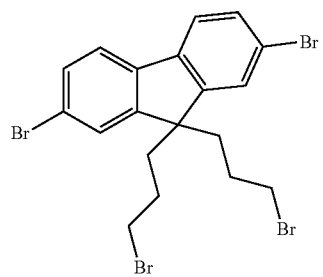
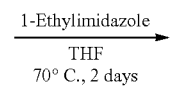

-continued
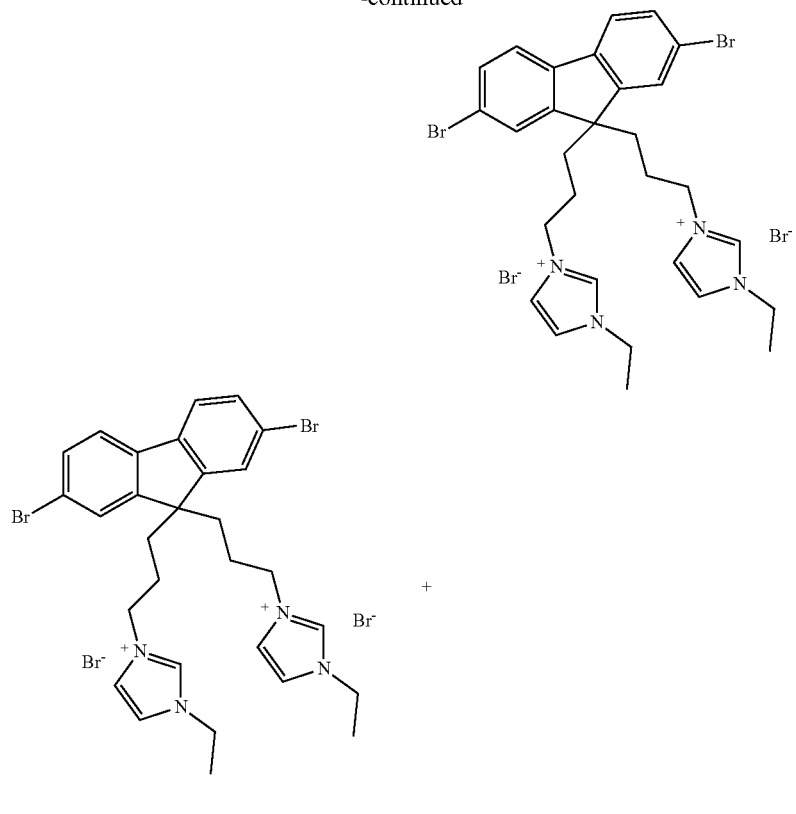
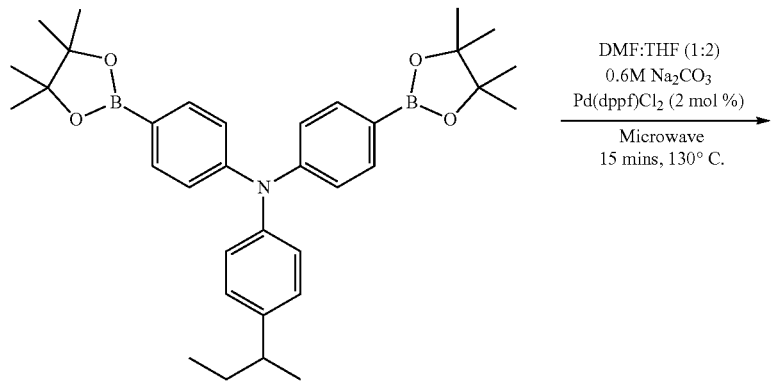
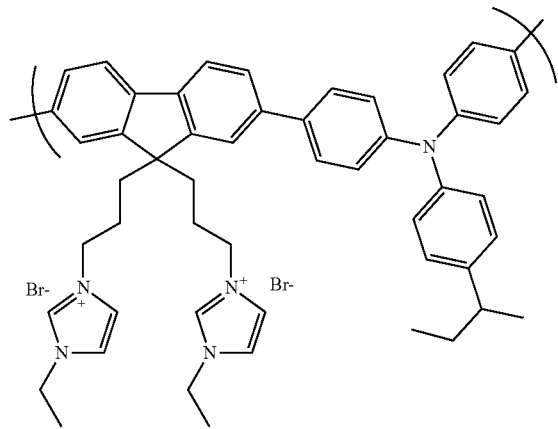

The invention claimed is:

1. A composition comprising:
   an organic semiconductor comprising one or more aromatic or heteroaromatic moieties;
   one or more cations covalently bonded to the organic semiconductor, or to a second material; and
   at least one anion donor selected from a class of divalent and higher valent anions, the anion donor having an electron detachment energy which is less than zero in a gas phase,
   wherein the organic semiconductor has an electron affinity between 1.5 and 4.5 eV,
   wherein the anion donor n-dopes the composition to form an n-doped organic semiconductor having a work function between 1.5 eV and 4.8 eV.

2. The composition according to claim 1, wherein the organic semiconductor has an electron affinity between 1.8 and 4.5 eV.

3. The composition according to claim 1, wherein the at least one anion donor is ionically bound to the one or more cations.

4. The composition according to claim 1, wherein the organic semiconductor has a fully conjugated backbone, a partially conjugated backbone, or a non-conjugated backbone and a conjugated aromatic or heteroaromatic moiety therefrom.

5. The composition according to claim 1, wherein the organic semiconductor is a polymer.

6. The composition according to claim 1, wherein the one or more cations is covalently bonded to the organic semiconductor.

7. The composition according to claim 5, wherein the one or more cations is a pendent group of a repeat unit of the polymer or wherein the one or more cations is a substituent of a repeat unit of the polymer.

8. The composition according to claim 7, wherein the repeat unit comprises a plurality of one or more cations pendent therefrom.

9. The composition according to claim 1, wherein the one or more cations that are covalently bonded are selected from ammonium of formula $R_4N^+$, sulfonium $R_3S^+$, phosphonium $R_4P^+$, guanidinium $(NR)_3C^+$, oxonium $R_3O^+$, borinium $R_2B^+$, or a combination thereof,
   wherein R is selected from $C_{1-12}$ alkyl, and optionally substituted phenyl.

10. The composition according to claim 1, further comprising untethered cationic groups, wherein a proportion of the untethered cationic groups relative to tethered cationic groups (cations covalently bonded to the organic semiconductor) is less than about 45%.

11. The composition according to claim 1, wherein a gas-phase electron donor level for the anion donor in a vacuum is shallower than a vacuum level.

12. The composition according to claim 1, wherein the anion donor is selected from the group consisting of oxalate, malonate, succinate, phosphate, phosphite, sulfate, sulfite, carbonate, ferrocyanide, and ferricyanide, or a combination thereof.

13. The composition according to claim 1 and the second material.

14. A formulation comprising the composition according to claim 1 dissolved or dispersed in a solvent comprising one or more solvent materials.

15. An organic electronic device comprising a layer of the composition according to claim 1, wherein the layer of composition is disposed between a first electrode and a second electrode.

16. The organic electronic device according to claim 15, wherein the organic electronic device is an organic light-emitting device; wherein the first electrode is an anode; the second electrode is a cathode; and further comprising a light-emitting layer disposed between the anode and the layer of composition.

17. The organic electronic device according to claim 15, wherein the layer of composition has an ohmic electron-injection or electron-extraction contact to an adjacent semiconductor layer having an electron affinity of up to about 1.8 eV.

18. The organic electronic device according to claim 15 wherein the layer comprising the n-doped organic semiconductor is an electron-injection layer or electron-extraction layer.

19. A method of forming an organic electronic device according to claim 17, the method comprising
   forming a layer comprising a composition comprising
      an organic semiconductor comprising one or more aromatic or heteroaromatic moieties;
      one or more cations covalently bonded to the organic semiconductor, or to a second material; and
      at least one anion donor selected from the class of divalent and higher valent anions,
      wherein the organic semiconductor has an electron affinity between 1.5 and 4.5 eV; and
   activating the anion donor to cause doping of the organic semiconductor.

20. The method according claim 19, wherein the layer comprising the composition is formed by depositing a formulation comprising the composition dissolved or dispersed in a solvent comprising one or more solvent materials, and evaporating the solvent.

21. The method according to claim 19, wherein the activation comprises reducing the water: anion donor molar ratio of the layer comprising the composition.

22. The method according to claim 19, wherein the layer comprising the composition undergoes a treatment of one or more of heating, vacuum treatment and exposure to a dry atmosphere.

23. The method of forming an organic electronic device according to claim 19, wherein the n-doped organic semiconductor is formed by formation of a layer comprising the composition between the first and second electrodes and activation of the anion donor to cause the anion donor to dope the organic semiconductor.

* * * * *